(12) United States Patent
Liu

(10) Patent No.: US 9,024,290 B2
(45) Date of Patent: May 5, 2015

(54) VERTICAL TRANSISTOR PHASE CHANGE MEMORY

(71) Applicant: Micron Technology, Inc., Boise, ID (US)

(72) Inventor: Jun Liu, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 14/445,669

(22) Filed: Jul. 29, 2014

(65) Prior Publication Data

US 2014/0353571 A1   Dec. 4, 2014

Related U.S. Application Data

(63) Continuation of application No. 13/494,622, filed on Jun. 12, 2012, now Pat. No. 8,816,316, which is a continuation of application No. 12/762,587, filed on Apr. 19, 2010, now Pat. No. 8,198,160.

(51) Int. Cl.
   *H01L 45/00*     (2006.01)
   *H01L 27/24*     (2006.01)

(52) U.S. Cl.
   CPC .......... *H01L 27/249* (2013.01); *H01L 27/2454* (2013.01); *H01L 27/2463* (2013.01); *H01L 45/06* (2013.01); *H01L 45/124* (2013.01); *H01L 45/143* (2013.01); *H01L 45/144* (2013.01); *H01L 45/148* (2013.01); *H01L 45/1691* (2013.01); *H01L 27/2481* (2013.01); *H01L 45/1253* (2013.01)

(58) Field of Classification Search
   CPC ............ H01L 27/2454; H01L 27/2463; H01L 27/249; H01L 27/2481; H01L 45/06; H01L 45/124; H01L 45/143; H01L 45/148; H01L 45/1691; H01L 45/1253; H01L 45/144
   USPC .................................... 257/2, 3, 4, 5
   See application file for complete search history.

(56) References Cited

U.S. PATENT DOCUMENTS 7,078,273 B2   7/2006   Matsuoka et al.
7,341,892 B2   3/2008   Matsuoka et al.

(Continued)

FOREIGN PATENT DOCUMENTS

CN   1819297 A   8/2006
CN   101174624 A   5/2008

(Continued)

OTHER PUBLICATIONS

Notice of Preliminary Rejection issued by the Korean Intellectual Property Office dated Oct. 21, 2013 from related Korean Application No. 10-2012-7030051, 11 pp.

(Continued)

*Primary Examiner* — Nikolay Yushin
(74) *Attorney, Agent, or Firm* — Brooks, Cameron & Huebsch, PLLC

(57) ABSTRACT

Vertical transistor phase change memory and methods of processing phase change memory are described herein. One or more methods include forming a dielectric on at least a portion of a vertical transistor, forming an electrode on the dielectric, and forming a vertical strip of phase change material on a portion of a side of the electrode and on a portion of a side of the dielectric extending along the electrode and the dielectric into contact with the vertical transistor.

20 Claims, 22 Drawing Sheets

(56) References Cited

U.S. PATENT DOCUMENTS

| | | |
|---|---|---|
| 7,359,226 B2 | 4/2008 | Schwerin |
| 7,532,507 B2 | 5/2009 | Hayakawa |
| 7,612,360 B2 | 11/2009 | Lee et al. |
| 7,759,764 B2 | 7/2010 | Lee et al. |
| 7,875,492 B2 | 1/2011 | Schwerin et al. |
| 7,932,129 B2 | 4/2011 | Lung |
| 8,283,648 B2 | 10/2012 | Liu |
| 2004/0233769 A1 | 11/2004 | Matsuoka et al. |
| 2006/0110878 A1 | 5/2006 | Lung et al. |
| 2006/0176261 A1 | 8/2006 | Nitta et al. |
| 2006/0284214 A1 | 12/2006 | Chen |
| 2007/0049011 A1 | 3/2007 | Tran |
| 2007/0120105 A1 | 5/2007 | Chao et al. |
| 2007/0165452 A1 | 7/2007 | Hayakawa |
| 2007/0176261 A1 | 8/2007 | Lung |
| 2007/0246782 A1 | 10/2007 | Philipp et al. |
| 2008/0099814 A1 | 5/2008 | Schwerin et al. |
| 2008/0185571 A1 | 8/2008 | Happ et al. |
| 2009/0001337 A1 | 1/2009 | Furukawa et al. |
| 2009/0014706 A1 | 1/2009 | Lung |
| 2009/0179184 A1 | 7/2009 | Liu |

FOREIGN PATENT DOCUMENTS

| | | |
|---|---|---|
| JP | 2003229537 A | 8/2003 |
| JP | 2007194238 A | 8/2007 |
| JP | 2008124775 A | 5/2008 |
| JP | 2010073879 A | 4/2010 |
| KR | 100805857 A | 2/2008 |
| TW | 200739882 A | 10/2007 |
| TW | I316752 B | 11/2009 |
| TW | 201010006 A | 3/2010 |
| WO | 2008027209 A2 | 3/2008 |
| WO | 2010104918 A1 | 9/2010 |

OTHER PUBLICATIONS

Notice of Rejection Ground from related Japanese patent application No. 2013-506133, dated Feb. 18, 2014, 6 pp.

Search Report from related European patent application No. 11772346.0, dated Jul. 7, 2014, 6 pp.

First Office Action from related Chinese patent application No. 201180019878.4, dated Sep. 18, 2014, 20 pp.

Office Action from related Taiwan patent application No. 100113574 dated Jul. 4, 2014, 12 pp.

VERTICAL TRANSISTOR PHASE CHANGE MEMORY

PRIORITY INFORMATION

This application is a Continuation of U.S. application Ser. No. 13/494,622 filed Jun. 12, 2012, which is a Continuation of U.S. application Ser. No. 12/762,587 filed Apr. 19, 2010, now U.S. Pat. No. 8,198,160, the contents of which are incorporated herein by reference.

TECHNICAL FIELD

The present disclosure relates generally to semiconductor memory devices, methods, and systems, and more particularly, to vertical transistor phase change memory.

BACKGROUND

Memory devices are typically provided as internal, semiconductor, integrated circuits in computers or other electronic devices. There are many different types of memory, including random-access memory (RAM), read only memory (ROM), dynamic random access memory (DRAM), synchronous dynamic random access memory (SDRAM), flash memory, and resistive, e.g., resistance variable, memory, among others. Types of resistive memory include programmable conductor memory, resistive random access memory (RRAM), and phase change random access memory (PCRAM), among others.

Memory devices such as phase change memory devices may be utilized as non-volatile memory for a wide range of electronic applications to provide high memory densities, high reliability, and low power consumption. Non-volatile memory may be used in, for example, personal computers, portable memory sticks, solid state drives (SSDs), digital cameras, cellular telephones, portable music players such as MP3 players, movie players, and other electronic devices.

Memory devices such as resistive memory devices may include a number of memory cells, e.g., resistive memory cells, arranged in a matrix, e.g., array. For example, an access device, such as a diode, a field effect transistor (FET), or bipolar junction transistor (BJT), of the memory cells may be coupled to an access line, e.g., word line, forming a "row" of the array. The memory elements of each memory cell may be coupled to a data line, e.g., bit line, in a "column" of the array. In this manner, the access device of a memory cell may be accessed through a row decoder activating a row of memory cells by selecting the word line coupled to their gates. The programmed state of a row of selected memory cells may be determined, e.g., sensed, by causing different currents, to flow in the memory elements depending on the resistance associated with a programmed state for a particular memory cell.

Memory cells such as phase change memory cells may be programmed, e.g., written, to a desired state. That is, one of a number of programmed states, e.g., resistance levels, can be set for a memory cell. For example, a single level cell (SLC) can represent one of two logic states, e.g., 1 or 0. Memory cells can also be programmed to one of more than two programmed states, such as to represent more than two binary digits, e.g., 1111, 0111, 0011, 1011, 1001, 0001, 0101, 1101, 1100, 0100, 0000, 1000, 1010, 0010, 0110, or 1110. Such cells may be referred to as multi state memory cells, multi-digit cells, or multilevel cells (MLCs).

Resistive memory cells such as PCRAM cells may store data by varying the resistance level of a resistive memory cell material, e.g., resistive memory element. The resistive memory element of a PCRAM cell may be a phase change material, such as Germanium-Antimony-Telluride (GST). The phase change material may exist in an amorphous, higher resistance state, or a crystalline, lower resistance state. The resistance state of the PCRAM cell may be altered by applying sources of energy to the cell, such as current pulses or pulses of light, among other sources of energy. For example, applying a programming current to a heater electrode adjacent the phase change material may heat the heater electrode, which in turn may heat the adjacent phase change material and alter the resistance state of the cell. This may result in the PCRAM cell being programmed to a particular resistance state, which may correspond to a data state. In a binary system, for example, the amorphous, higher resistance state may correspond to a data state of 1, and the crystalline, lower resistance state may correspond to a data state of 0. However, the choice of these corresponding data states may be reversed, that is, in other binary systems, the amorphous, higher resistance state may correspond to a data state of 0, and the crystalline, lower resistance state may correspond to a data state of 1.

DETAILED DESCRIPTION

Figure 1A:
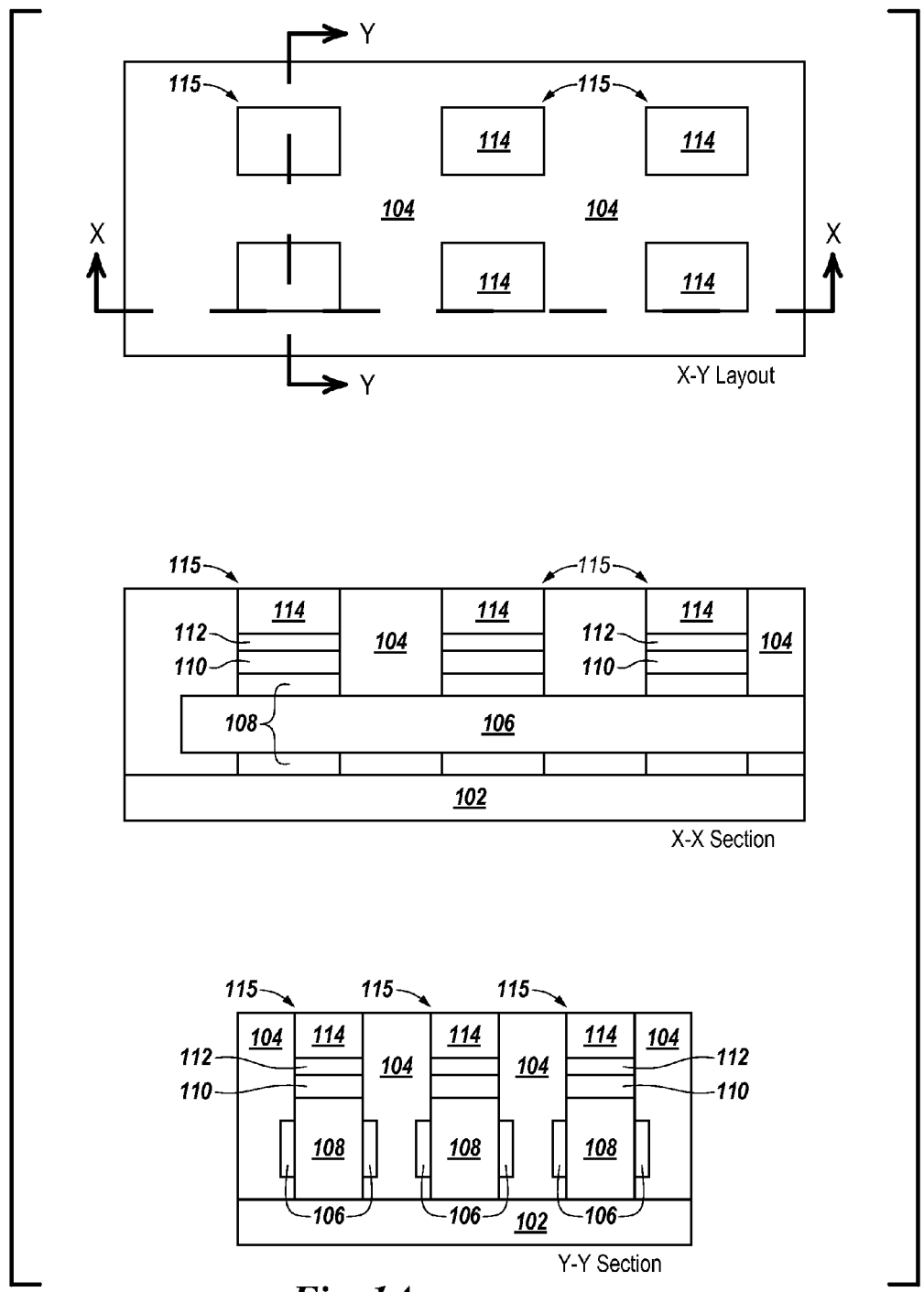
FIGS. 1A-1G illustrate process stages associated with forming a phase change memory cell in accordance with embodiments of the present disclosure.

Vertical transistor phase change memory and methods of processing phase change memory are described herein. One or more method embodiments include forming a dielectric on at least a portion of a vertical transistor, forming an electrode on the dielectric, and forming a vertical strip of phase change material on a portion of a side of the electrode and on a portion of a side of the dielectric extending along the electrode and the dielectric into contact with the vertical transistor.

Fabricating phase change memory, e.g., phase change memory cells or phase change memory devices, in accordance with embodiments of the present disclosure can provide $4F^2$ architecture with self-aligned cell contact of the phase change material to the electrodes. $4F^2$ architecture can include memory cells having a cross-sectional area approximately equal to the square of a smallest achievable feature width (F), e.g., photolithographic dimension. Further, processing phase change memory in accordance with embodiments of the present disclosure can reduce the programming current used to program, e.g., change the state of, phase change memory cells. Fabricating phase change memory in accordance with embodiments of the present disclosure can provide effective current path cross-sectional area dependent on lithography in only one dimension, and/or in some embodiments, entirely independent of lithography variation. Additionally, fabricating phase change memory in accordance with embodiments of the present disclosure can provide efficient implementation of line and/or space patterning.

In the following detailed description of the present disclosure, reference is made to the accompanying drawings that form a part hereof, and in which is shown by way of illustration how a number of embodiments of the disclosure may be practiced. These embodiments are described in sufficient detail to enable those of ordinary skill in the art to practice a number of embodiments of this disclosure, and it is to be understood that other embodiments may be utilized and that process, electrical, or mechanical changes may be made without departing from the scope of the present disclosure.

As will be appreciated, elements shown in the various embodiments herein can be added, exchanged, and/or eliminated so as to provide a number of additional embodiments of the present disclosure. In addition, as will be appreciated, the proportion and the relative scale of the elements provided in the figures are intended to illustrate the embodiments of the present invention, and should not be taken in a limiting sense. As used herein, "a number of" something can refer to one or more such things. For example, a number of memory devices can refer to one or more memory devices.

As used herein, a "bottom electrode" can refer to an electrode that is directly connected to an access device, e.g., by an access device contact. As used herein, a "top electrode" can refer to an electrode that is not directly connected to an access device, e.g., an electrode that does not include an access device contact.

When an element is referred to as being "directly connected" to another element, there are no intervening elements present between the two elements, other than any native oxide that may form after formation of one element but before formation of the other element. For example, a "bottom electrode" as used herein may have no intervening elements present between the bottom electrode and an access device, other than any native oxide that may form after formation of the bottom electrode but before formation of the access device. In contrast, a "top electrode" as used herein may have intervening elements, e.g. a resistive memory cell material and bottom electrode, between the top electrode and an access device.

The various processing stages described herein, including formation of components using materials, can include the use of deposition of material in a number of ways known in the art. Some examples include chemical vapor deposition (CVD) and/or atomic layer deposition (ALD), among others. Processing stages involving the removal of material can include the use of, for example, photolithography, patterning, wet and/or dry etching, and the like, as will be appreciated by one of skill in the art.

The figures herein follow a numbering convention in which the first digit or digits correspond to the drawing figure number and the remaining digits identify an element or component in the drawing. Similar elements or components between different figures may be identified by the use of similar digits. For example, 114 may reference element "14" in FIGS. 1A-1H, and a similar element may be referenced as 214 in FIGS. 2A-2F. As will be appreciated, elements shown in the various embodiments herein can be added, exchanged, and/or eliminated so as to provide a number of additional embodiments of the present disclosure. In addition, as will be appreciated, the proportion and the relative scale of the elements provided in the figures are intended to illustrate the embodiments of the present invention, and should not be taken in a limiting sense.

FIGS. 1A-1G illustrate process stages associated with forming a phase change memory cell in accordance with embodiments of the present disclosure. FIGS. 1A-1H illustrate top plan views (XY) of a number of vertical transistors 115, first cross-sectional views (X) taken along cut line X-X, and second cross-sectional views (Y) taken along cut line Y-Y. As illustrated in FIG. 1A, the vertical transistors 115 can be formed on a substrate 102. The substrate can be a silicon substrate, silicon on insulator (SOI) substrate, silicon on metal from wafer bonding, or silicon on sapphire (SOS) substrate, among others such as silicon dioxide ($SiO_2$). The vertical transistors 115 can have a common source and common side gates 106. Side gates 106 can be formed of a conductive material and can be formed in contact with opposite sides of a base 108 of a vertical transistor pillar, e.g., P– doped silicon, as shown in the Y cross-sectional view of FIG. 1A. Side gates 106 can run along a plurality of vertical transistors 115 as shown in the X cross-sectional view of FIG. 1A. Side gates 106 can be formed on opposite sides of the base of the vertical transistor pillar 108 such that they contact the base 108 of the vertical transistor pillar, but do not contact the substrate 102 nor contact the region 110, e.g., N+ doped silicon. The side gates 106 may be separated from the base 108 by a thin gate oxide. Some embodiments may include only one side gate 106 rather than two side gates 106.

Adjacent vertical transistors 115 can be separated by a bulk dielectric material 104 such as silicon dioxide. A top of the base 108 of the vertical transistor pillar can be processed to form an N+ doped silicon region 110 by methods known to those skilled in the art. The top of the N+ doped silicon region 110 can be processed to form a silicide 112, e.g., cobalt silicide ($CoSi_2$) by deposition of cobalt on the vertical transistor pillar followed by thermal annealing. The vertical transistors 115 can be further processed to include an electrode 114 on top of the silicide 112, e.g., on top of a vertical pillar including the silicide 112. The electrode 114 can be formed of a conductive material, e.g., tungsten, titanium nitride, etc. Although, as illustrated in FIG. 1A, the electrode 114 is on top of the vertical transistor 115, as will become apparent according to subsequent processing stages described herein, the electrode 114 can be referred to as a bottom electrode 114 for a vertical transistor phase change memory cell 100. The side gates 106, as part of a larger array of memory cells, can be referred to as an access line, e.g., a word line, as described in more detail herein. The vertical transistor 115, e.g., a metal oxide semiconductor field effect transistor (MOSFET), can serve as an access device for the phase change memory cell 100. Although the present disclosure includes the use of MOSFET access devices, other access devices may be used such as bipolar junction transistors (BJT) or diodes, among others.

Figure 1B:
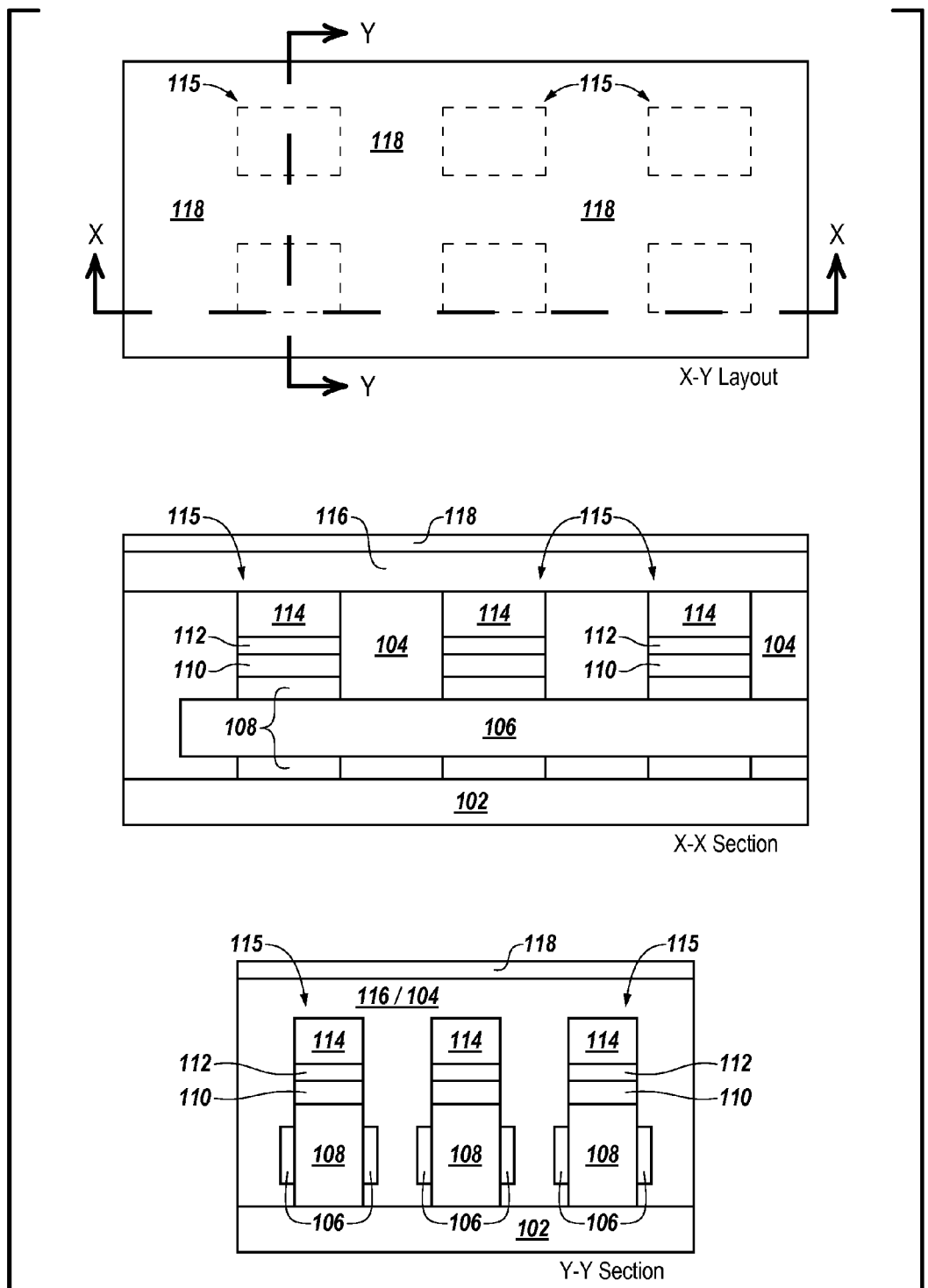

FIG. 1B illustrates further processing subsequent to the processing stage illustrated in FIG. 1A. A dielectric 116 can be formed, e.g., deposited, on the array of vertical transistors 115. More specifically, the dielectric 116 can be formed on the bottom electrodes 114 and on the bulk material 104. The dielectric 116 can be, for example, silicon dioxide, however other dielectric materials can be used. In some embodiments, the dielectric 116 can be formed of the same material as the bulk material 104; however, embodiments are not so limited. Thus, for example, in the Y cross-sectional view of FIG. 1B, the formed dielectric 116 is illustrated without any demarcation between the dielectric and the bulk material 104, e.g., "116/104," however in the X cross-sectional view of FIG. 1B, the dielectric 116 is illustrated with a demarcation between it and the bulk material 104. Such variance in illustration is intended to show that the dielectric 116 can be formed of a same material as the bulk material 104 or a different material.

An electrode 118 can be formed, e.g., deposited, on the dielectric 116. The electrode 118 can be formed of a conductive material, e.g., tungsten, titanium nitride, or copper, among others. With respect to electrode 114, e.g., the "bottom electrode 114," the electrode 118 can be referred to herein as a "top electrode 118," with respect to a vertical transistor phase change memory cell. The top electrode 118, as part of a larger array of memory cells can be referred to as a data line, e.g., a bit line, as describe in more detail herein.

Figure 1C:
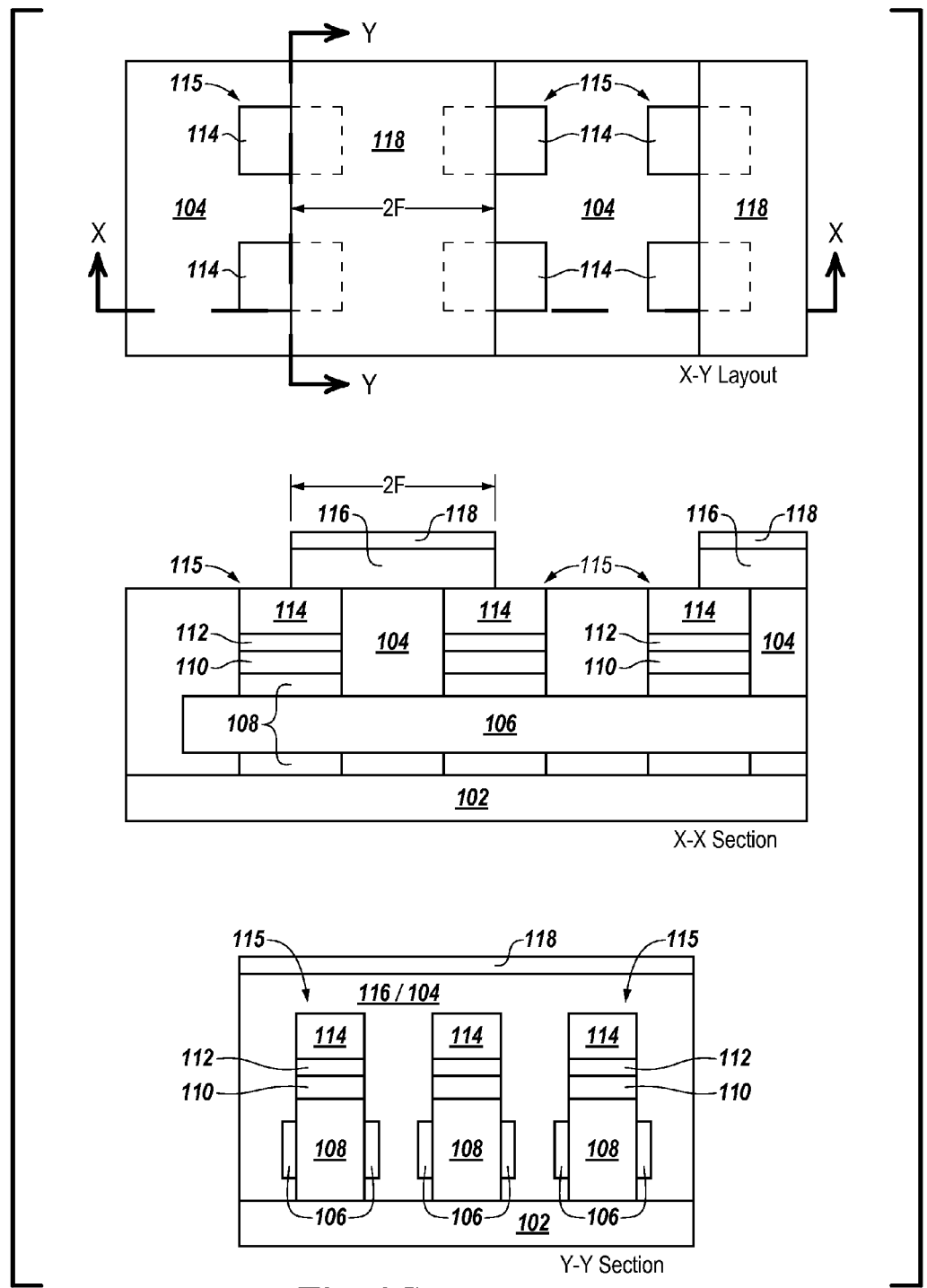

FIG. 1C illustrates further processing subsequent to the processing stage illustrated in FIG. 1B. Portions of the dielectric 116 and top electrode 118 can be removed. For example, the top electrode 118 can be patterned into lines on half-pitch in the Y direction and then etched to remove both dielectric 116 and top electrode 118 materials. Thus, the removed portions of the dielectric 116 and top electrode 118 can be separated by two feature widths (2F) in the X direction, e.g., the remaining portions of dielectric 116 and top electrode 118 can be 2F wide. The 2F of remaining dielectric 116 and top electrode 118 material can span, in the X direction, from a position above a first vertical transistor 115 near its center point to a position above an adjacent vertical transistor 115 near its center point. Thus, the dielectric 116 is formed above a portion of the vertical transistors 115, e.g., on a portion of the bottom electrode 114 of the vertical transistor 115. The removed portions of the dielectric 116 and top electrode 118 can also be 2F wide, however embodiments are not so limited.

Figure 1D:
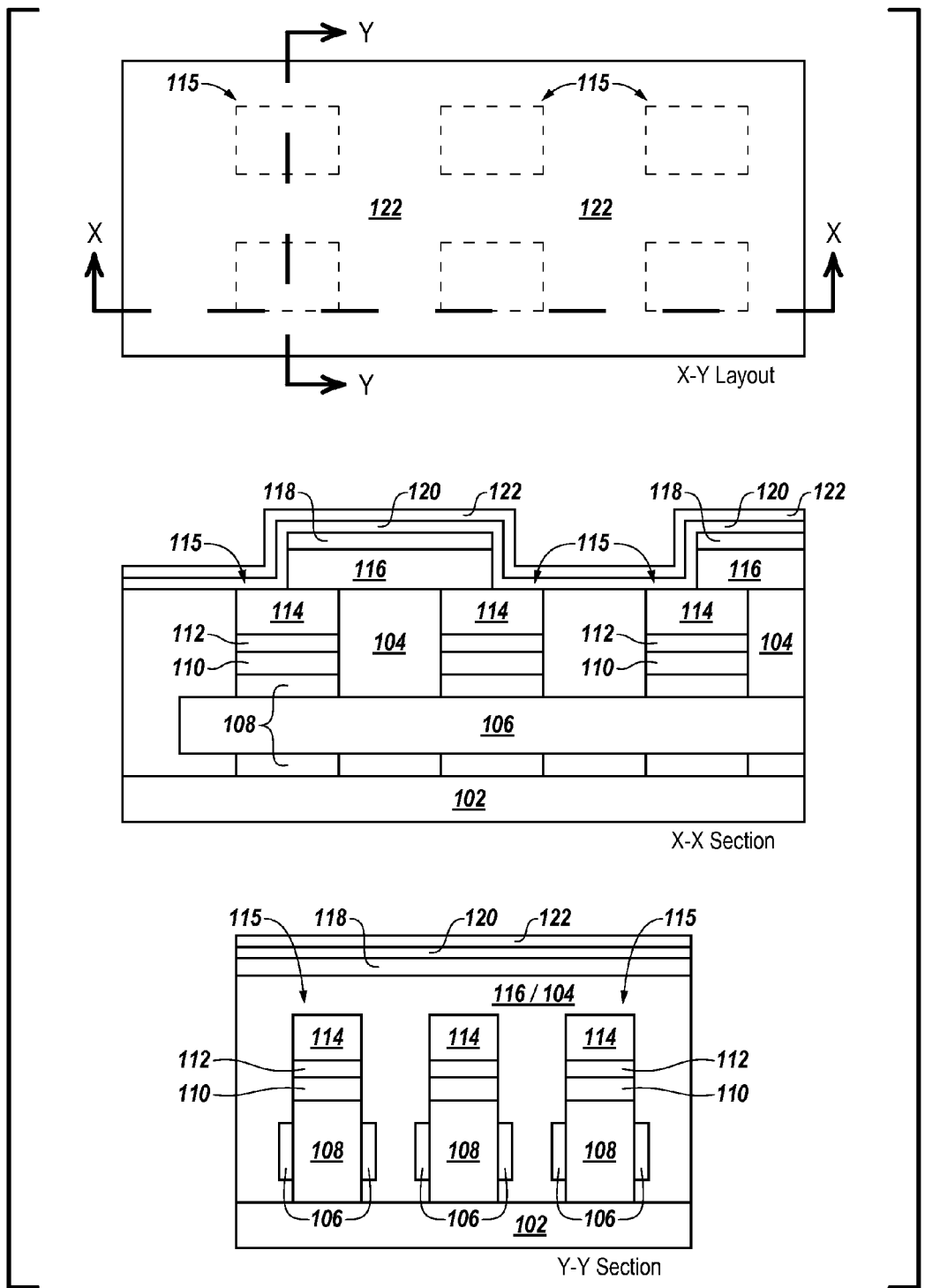

FIG. 1D illustrates further processing subsequent to the processing stage illustrated in FIG. 1C. Phase change material 120 can be formed on the top electrode 118. In some embodiments, the phase change material 120 can be conformally deposited on the top electrode 118 such that a substantially uniform thickness in a vertical direction and/or horizontal direction, as illustrated in the X and Y cross-sectional views of FIG. 1D, is formed at least on top of the top electrode 118, on side surfaces of the top electrode 118, on the exposed side surfaces of the dielectric 116, and on a top surface of the bottom electrode 114, e.g., on top of the vertical transistors 115. As illustrated in the cross-sectional view in the X direction of FIG. 1D, the phase change material 120 can also be formed on the bulk material 104.

Phase change material 120 can include, for example, phase change chalcogenide alloys such as Germanium-Antimony-Tellurium (GST) materials, e.g., Ge—Sb—Te materials such as $Ge_2Sb_2Te_5$, $Ge_1Sb_2Te_4$, $Ge_1Sb_4Te_7$, etc. The hyphenated chemical composition notation, as used herein, indicates the elements included in a particular mixture or compound, and is intended to represent all stoichiometries involving the indicated elements. Other phase change materials can include, for example, Ge—Te, In—Se, Ge—Sb, Sb—Te, Ga—Sb, In—Sb, As—Te, Al—Te, Ge—Sb—Te, Te—Ge—As, In—Sb—Te, Te—Sn—Se, Ge—Se—Ga, Bi—Se—Sb, Ga—Se—Te, Sn—Sb—Te, In—Sb—Ge, Te—Ge—Sb—S, Te—Ge—Sn—O, Te—Ge—Sn—Au, Pd—Te—Ge—Sn, In—Se—Ti—Co, Ge—Sb—Te—Pd, Ge—Sb—Te—Co, Sb—Te—Bi—Se, Ag—In—Sb—Te, Ge—Sb—Se—Te, Ge—Sn—Sb—Te, Ge—Te—Sn—Ni, Ge—Te—Sn—Pd, and Ge—Te—Sn—Pt, among various other phase change materials. However, embodiments of the present disclosure are not limited to a particular type of phase change material.

An additional dielectric 122 can be formed on the phase change material 120. In some embodiments, the additional dielectric 122 can be conformally deposited on the phase change material 120 such that a substantially uniform thickness in a vertical direction and/or horizontal direction, as illustrated in X and Y cross-sectional views of FIG. 1D, is formed at least on the top and/or sides of the phase change material 120. The dielectric can be, for example, an oxide dielectric, such as silicon dioxide, or a nitride dielectric, such as silicon nitride ($Si_3N_4$). However, embodiments of the present disclosure are not limited to a particular type of dielectric.

Figure 1E:
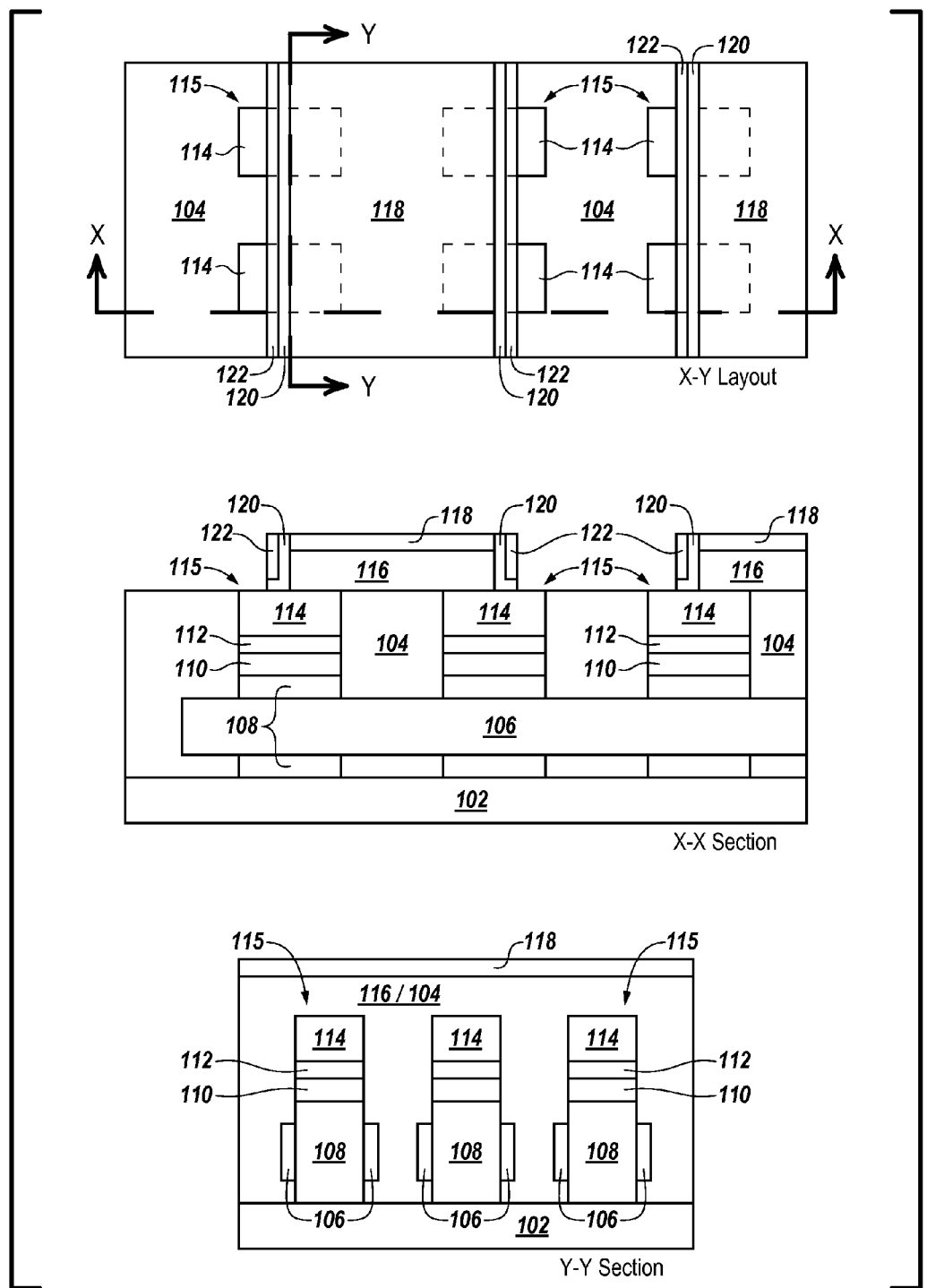

FIG. 1E illustrates further processing subsequent to the processing stage illustrated in FIG. 1D. Portions of the additional dielectric 122 and phase change material 120 can be removed, e.g., spacer etched, from a top of the array of vertical transistors 115 to a depth equal to a thickness of the additional dielectric 122 plus a thickness of the phase change material 120, e.g., thicknesses of the conformal depositions of both of the additional dielectric 122 and the phase change material 120. As illustrated in the X cross-sectional view of FIG. 1E, such removal can leave phase change material 120 on sides of the dielectric 116 and the top electrode 118. Furthermore, such removal can leave a vertical spacer of additional dielectric 122 on a top of the phase change material 120 and on a side of the phase change material 120 opposite the side surfaces of the dielectric 116 and the top electrode 118. The vertical spacer of additional dielectric 122 remains on a notch of phase change material 120, which remains on the bottom electrode 114.

Figure 1F:
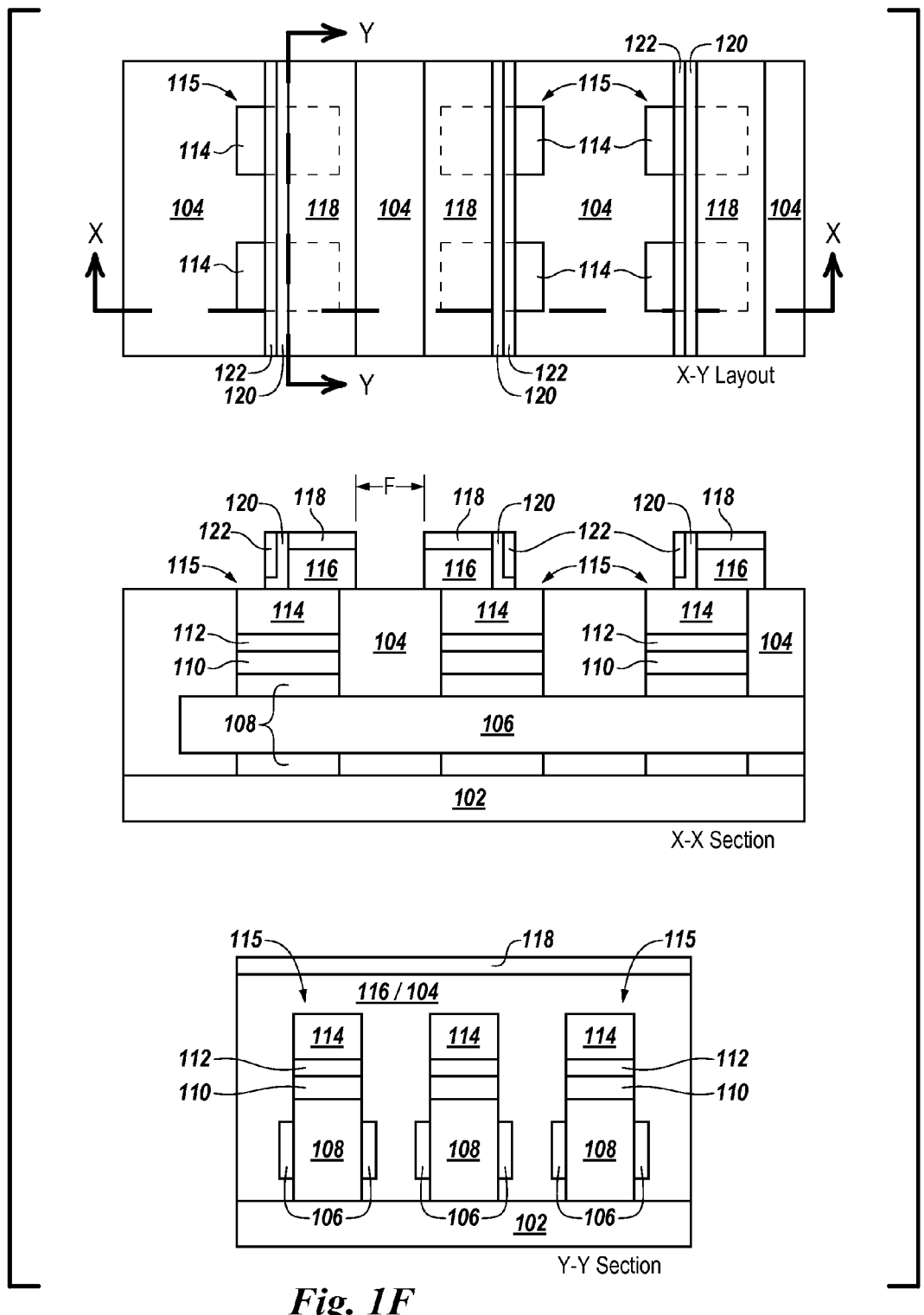

FIG. 1F illustrates further processing subsequent to the processing stage illustrated in FIG. 1E. As best illustrated in the X cross-sectional view and the XY top plan view of FIG. 1F, one feature width (F) of material, e.g., top electrode 118 and dielectric 116, can be removed. The material can be removed between, e.g., from the middle in the X direction, the 2F wide in the X direction remaining portions of dielectric 116 and top electrode material 118. The material can be removed down to a height of the array of vertical transistors 115, e.g., to the top of the bulk material 104 and/or to the top of the bottom electrode 114 as illustrated. For example, such removal can be accomplished by photolithography and dry etching in the Y direction to isolate adjacent remaining portions of phase change material 120.

Figure 1G:
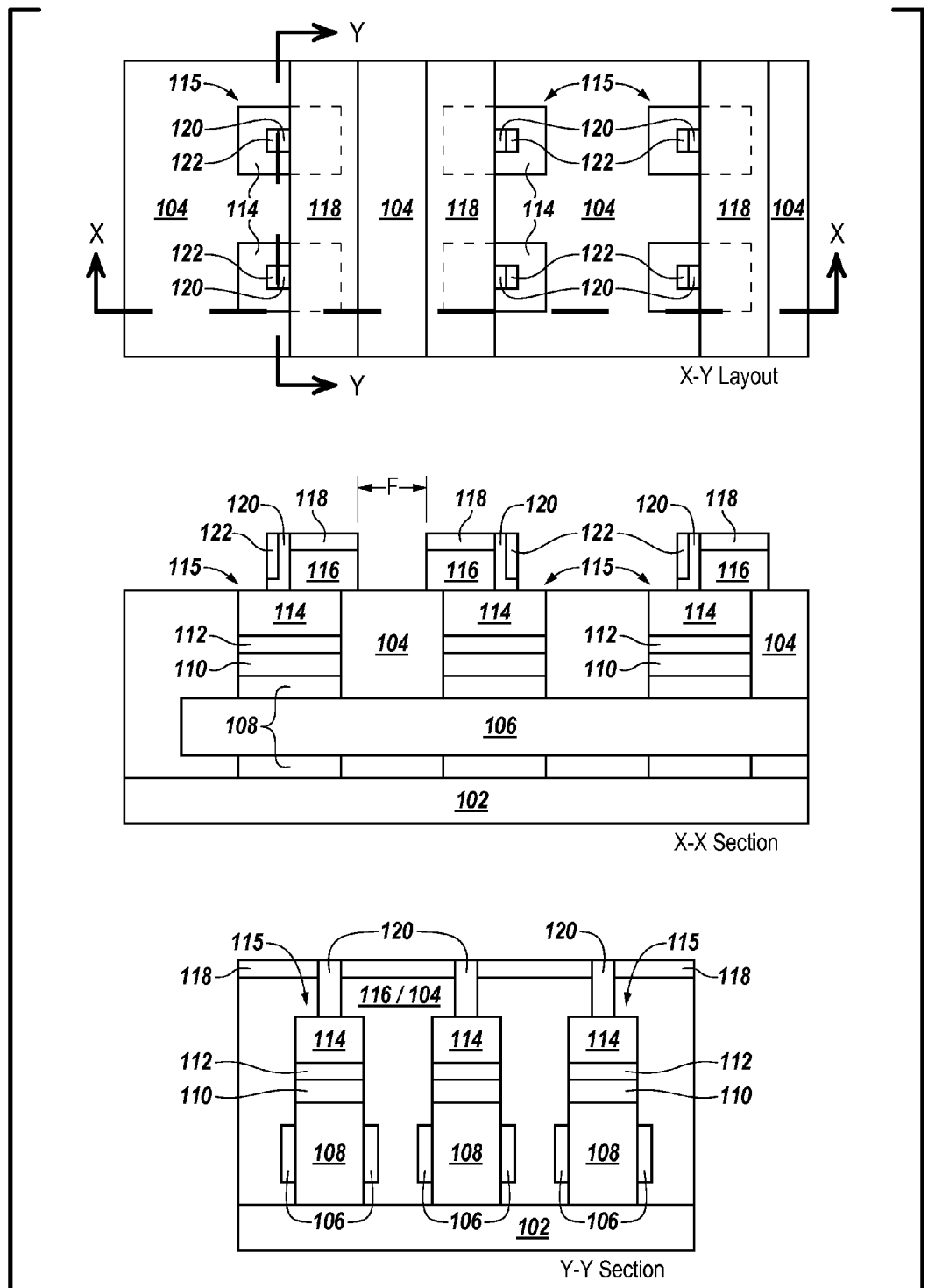

FIG. 1G illustrates further processing subsequent to the processing stage illustrated in FIG. 1F. As best illustrated in the XY top plan view of FIG. 1G, portions of the phase change material 120 and the additional dielectric 122 can be removed between vertical transistors 115 that are adjacent to each other in the Y direction. For example, such removal can be accomplished by photolithography and dry etch of the phase change material 120 and/or the additional dielectric 122 in the X direction to form isolated vertical spacer cells. Thus, such removal can leave a vertical strip of phase change material 120 formed on a portion of a side of the top electrode 118 and a portion of a side of the dielectric 116 extending along the top electrode 118 and the dielectric 116 in a vertical direction into contact with the bottom electrode 114, e.g., the vertical transistor 115 that underlies the phase change material 120. The same is illustrated in more detail by the perspective view of the vertical transistor phase change memory cell 100 provided in FIG. 1H.

Figure 1H:
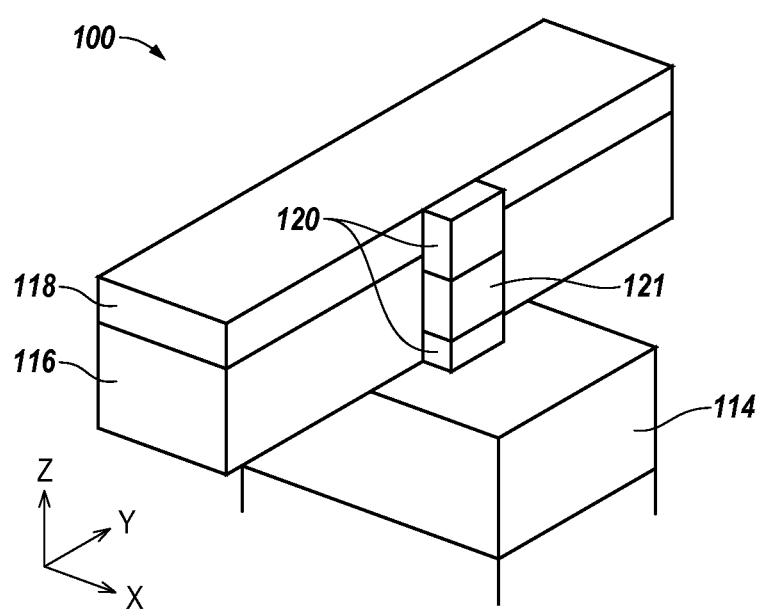
FIG. 1H illustrates a perspective view of a phase change memory cell in accordance with embodiments of the present disclosure.

FIG. 1H illustrates a perspective view of a phase change memory cell 100 in accordance with embodiments of the present disclosure. As illustrated in FIG. 1H, the phase change material 120 extends across only a portion of the width (in the Y direction) of the side of the dielectric 116 and the top electrode 118. That is, a width (in the Y direction) of the phase change material 120 is less than a width (in the Y direction) of the side surface of the top electrode 118. The phase change material 120 extends across the entire height (in the Z direction) of the dielectric 116 and the top electrode 118, e.g., from a top surface of the top electrode 118 to a top surface of the bottom electrode 114. The phase change material 120 is in direct physical contact with the top electrode 118, the dielectric 116, and the bottom electrode 114. The width (in the Y direction) of the phase change material 120 is less than a width (in the Y direction) of the top surface of the bottom electrode 114.

The phase change material 120 can be on, and in contact with, the dielectric 116 and the top electrode 118 by a common plane, e.g., a Y-Z plane as illustrated in FIG. 1H. The common plane can include side surfaces of the dielectric 116, the top electrode 118, and the phase change material 120.

The additional dielectric 122 is omitted from the illustration of FIG. 1H in order to provide a better illustration of the active region 121 of the phase change material 120 created by operation of the vertical transistor phase change memory cell 100 according to embodiments of the present disclosure. As one of ordinary skill in the art will appreciate, the active region 121 of a phase change memory cell 100 is the region that can be switched between a more amorphous state and a more crystalline state in order to represent, e.g., store, data. A remainder of the phase change material 120 can remain in a generally crystalline state during operation of the phase change memory cell 100. As illustrated in FIG. 1H, the active region 121 is located between the bottom electrode 114 and the top electrode 118. According to one or more embodiments of the present disclosure, the active region 121 can be in contact with the dielectric 116, but not in direct physical contact with either of the bottom electrode 114 or the top electrode 118. The strip of phase change material 120 forms a self-aligned contact with the top electrode 118.

Figure 2A:
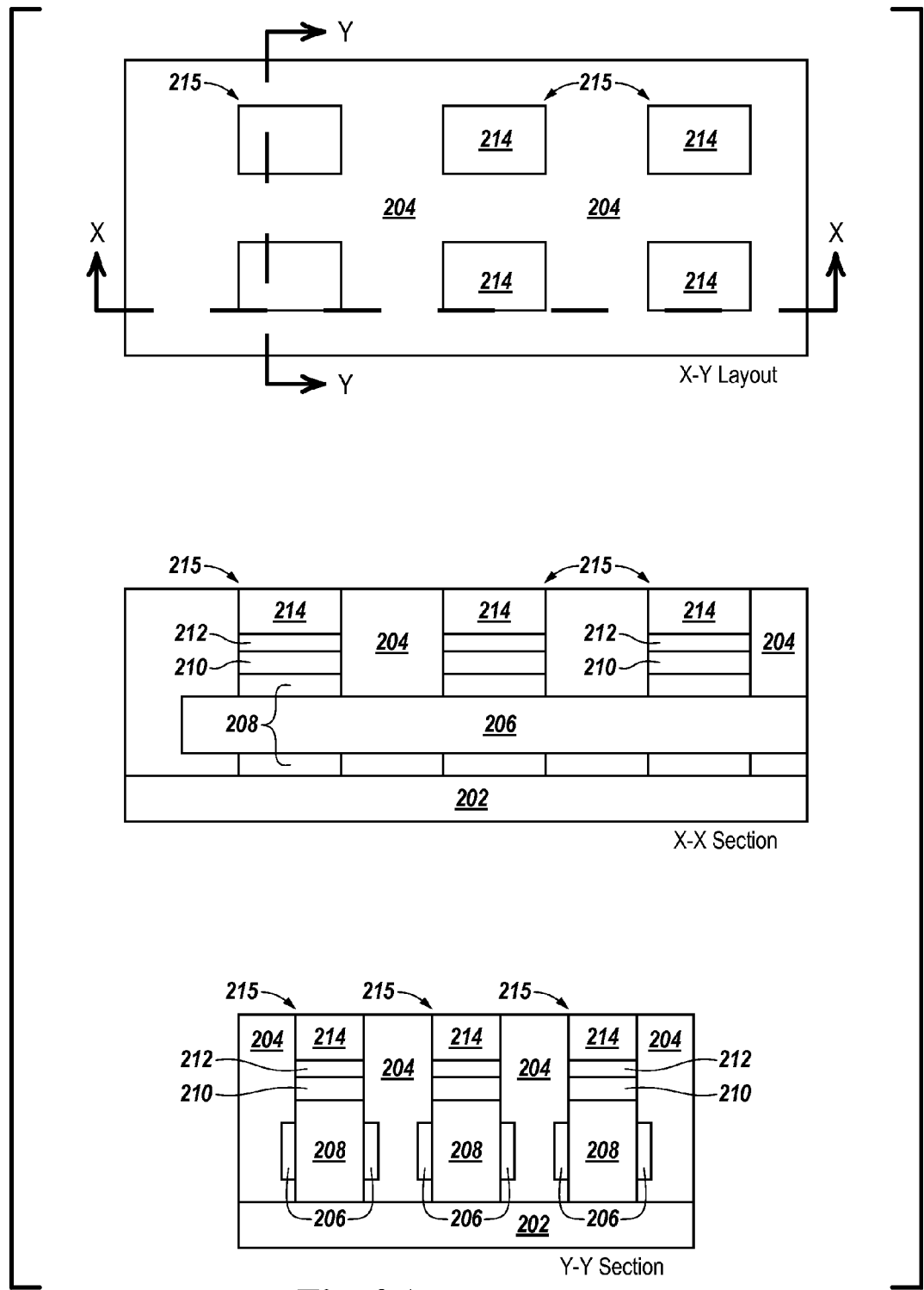
FIGS. 2A-2F illustrate process stages associated with forming a phase change memory cell in accordance with embodiments of the present disclosure.
Figure 2B:
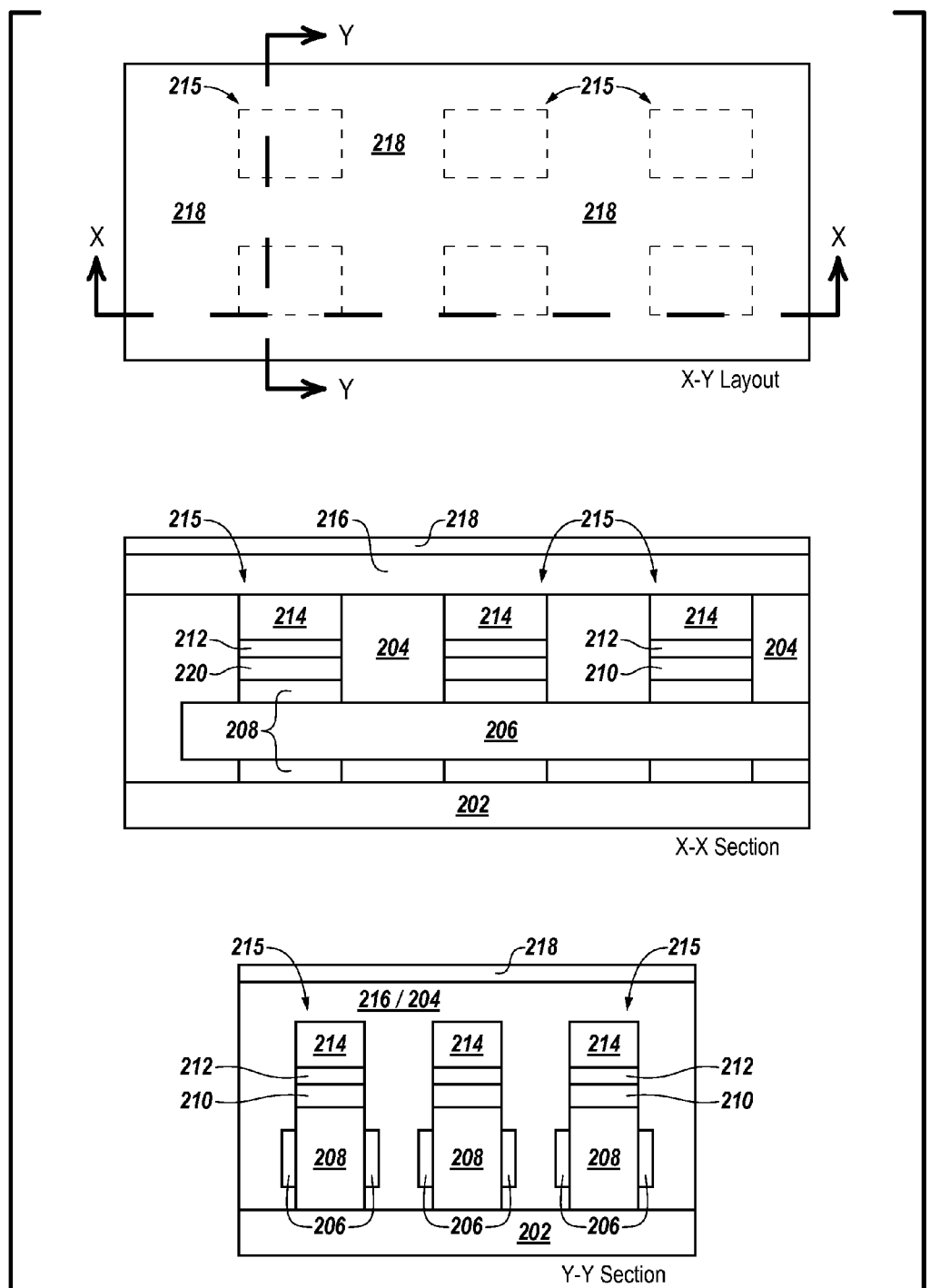

FIGS. 2A-2F illustrate process stages associated with forming a phase change memory cell in accordance with embodiments of the present disclosure. FIGS. 2A-2F illustrate top plan views (XY) of a number of vertical transistors 215, first cross-sectional views (X) taken along cut line X-X, and second cross-sectional views (Y) taken along cut line Y-Y. FIGS. 2A-2B are analogous to FIGS. 1A-1B respectively. Thus, the vertical transistors 215 can be formed on a substrate 202 and can have a common source and side gates 206. Side gates 106 can be formed in contact with opposite sides of a base 208 of a vertical transistor pillar, as shown in the Y cross-sectional view of FIG. 2A. Adjacent vertical transistors 215 can be separated by a bulk material 204. A top of the base 208 of the vertical transistor pillar can be processed to form an N+ doped region 210. The top of the N+ doped region 210 can be processed to form a silicide 212. The vertical transistors 215 can be further processed to include a bottom electrode 214 on top of the silicide 212. A dielectric 216 can be formed on the array of vertical transistors 215. A top electrode 218 can be formed on the dielectric 216.

Figure 2C:
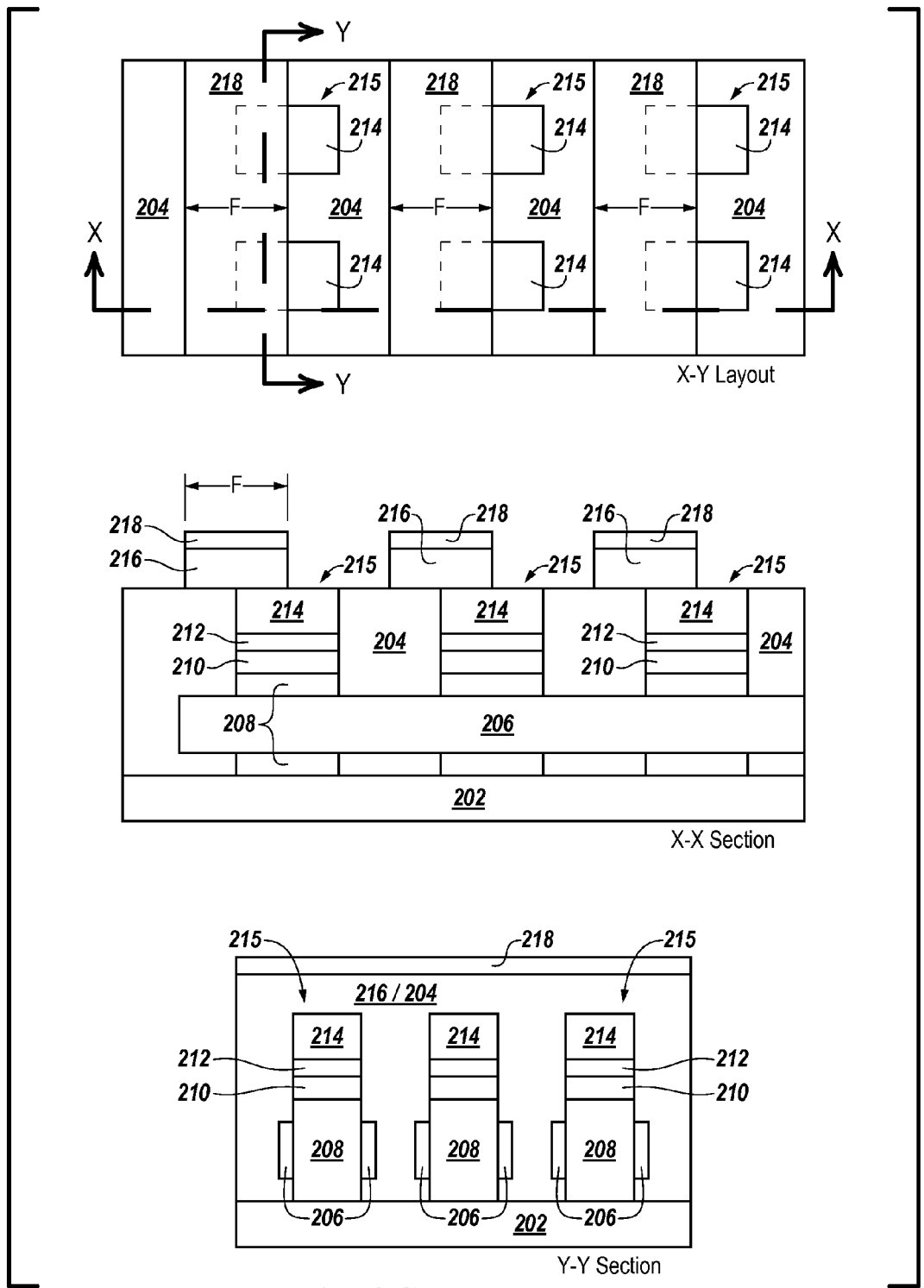

FIG. 2C illustrates further processing subsequent to the processing stage illustrated in FIG. 2B. Portions of the dielectric 216 and top electrode 218 can be removed. For example, the top electrode 218 can be patterned into lines on pitch in the Y direction and then etched to remove both dielectric 216 and top electrode 218 materials. Thus, the removed portions of the dielectric 216 and top electrode 218 can be separated by one feature width (F) in the X direction, e.g., the remaining portions of dielectric 116 and top electrode 118 can be 1F wide.

The 1F of remaining dielectric 216 and top electrode 218 material can span, in the X direction, from a position above a particular vertical transistor 215 to a position above adjacent bulk material 204 between the particular vertical transistor 215 and an adjacent vertical transistor 215 in the X direction. Thus, the dielectric 216 is formed above a portion of the vertical transistors 215, e.g., on a portion of the bottom electrode 214 of the vertical transistor 215.

The processing stage illustrated in FIG. 2C differs from that illustrated in FIG. 1C in that the top electrode 218 is patterned on pitch with respect to FIG. 2C rather than on half-pitch with respect to FIG. 1C. Thus, the embodiment illustrated in FIG. 1C leaves a 2F width of remaining dielectric 116 and top electrode 118 while the embodiment illustrated in FIG. 2C leaves a 1F width of remaining dielectric 216 and top electrode 218.

Figure 2D:
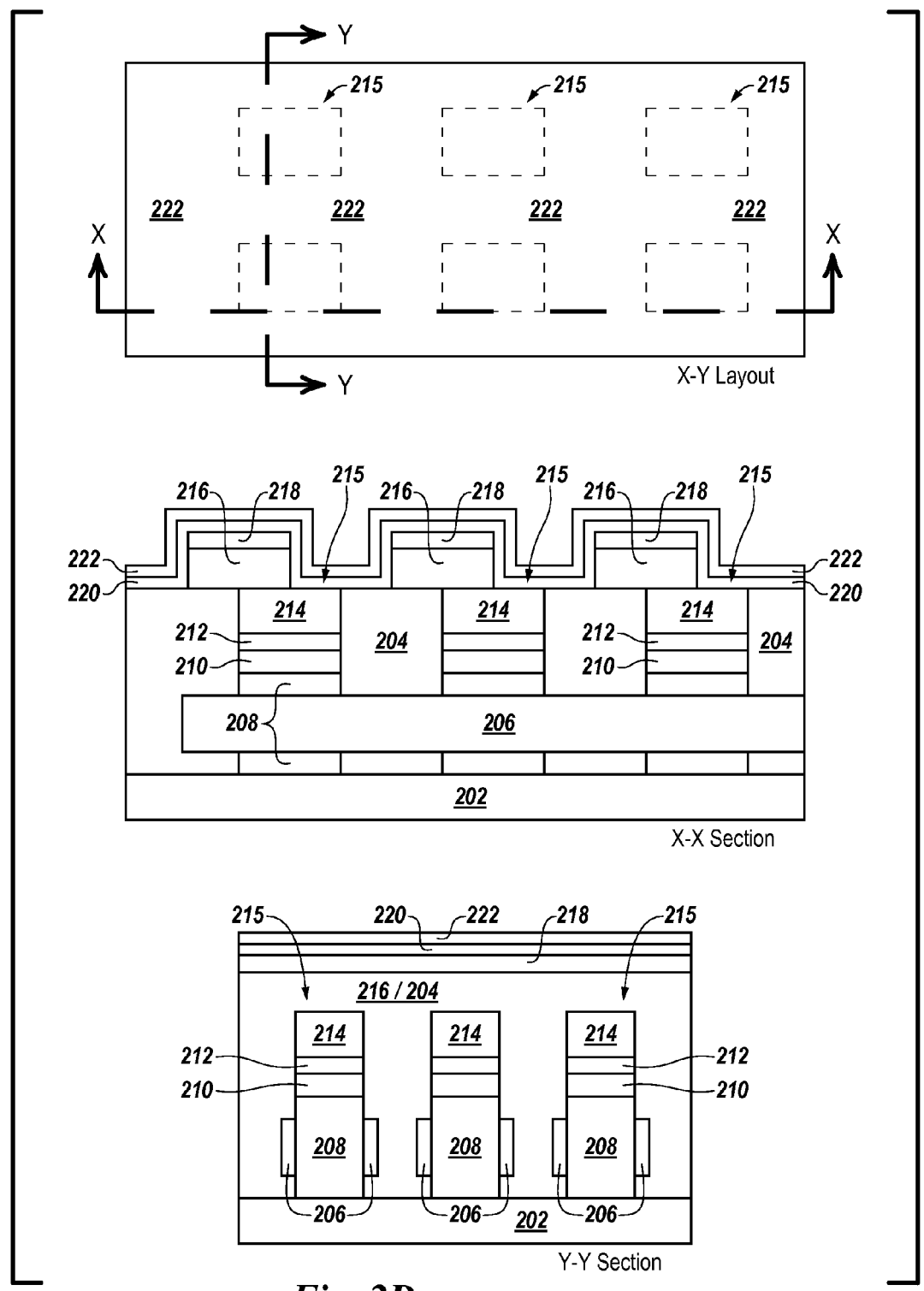
Figure 2E:
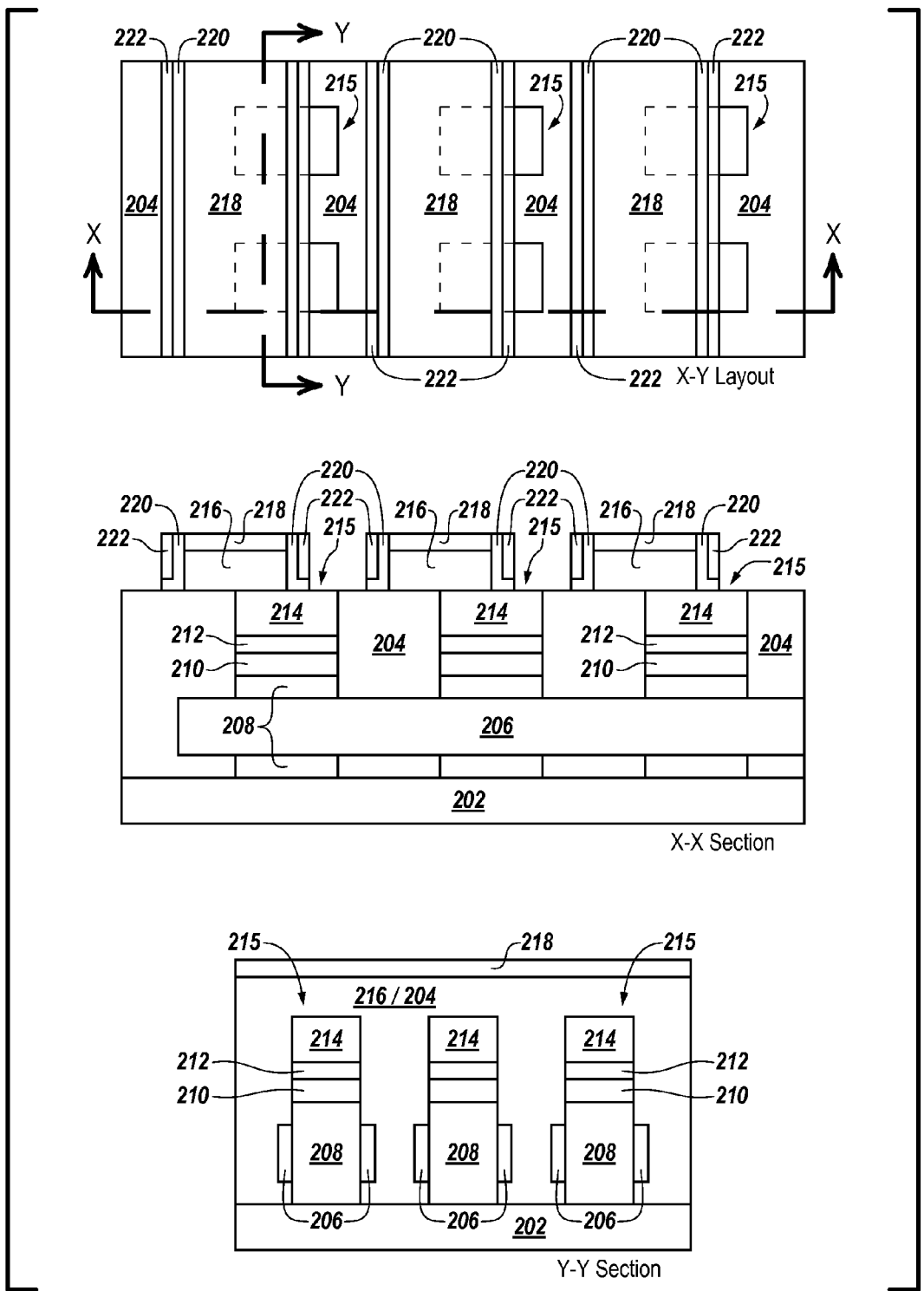

The process stages of FIGS. 2D-2E are analogous to those of FIGS. 1D-1E respectively, with the exception of the underlying structural and/or material differences described above with respect to FIGS. 1C and 2C. That is, phase change material 220 can be formed, e.g., conformally deposited, on the top electrode 218 as described herein. An additional dielectric 222 can be formed, e.g., conformally deposited, on the phase change material 220 as described herein. Portions of the additional dielectric 222 and phase change material 220 can be removed, e.g., spacer etched, from a top of the array of vertical transistors 215 to a depth equal to a thickness of the additional dielectric 222 plus a thickness of the phase change material 220, e.g., thicknesses of the conformal depositions of both of the additional dielectric 222 and the phase change material 220. As illustrated in the X cross-sectional view of FIG. 2E, such removal can leave phase change material 220 on sides of the dielectric 216 and the top electrode 218. Furthermore, such removal can leave a vertical spacer of additional dielectric 222 on a top of the phase change material 220 and on a side of the phase change material 220 opposite the side surfaces of the dielectric 216 and the top electrode 218.

In FIG. 1E the vertical spacer of additional dielectric 122 remained on a notch of phase change material 120, which remained on bottom electrodes 114 on either side of the dielectric 116 and top electrode 118. In contrast, in FIG. 2E, one side of the remaining dielectric 216 and top electrode 218 includes a vertical spacer of additional dielectric 222 on a notch of phase change material 220, which remains on a bottom electrode 214. However, the opposite side of the dielectric 216 and top electrode 218 includes a vertical spacer of additional dielectric 222 on a notch of phase change material 220, which remains on the bulk material 204, e.g., not on a conductive structure. Accordingly, the phase change material 220 and vertical spacer of additional dielectric 222 above the bulk material 204 is not used to form a portion of a phase change memory cell, e.g., it does not contribute to operation of a memory cell. However, maintaining the unused portions of phase change material 220 and vertical spacer of additional dielectric 222 can reduce the number of processing stages and/or reduce the amount of processing time in some embodiments. For example, the embodiments of FIGS. 2A-2F can include fewer processing stages than the embodiments of FIGS. 1A-1G. That is, the embodiments of FIGS. 2A-2F do not include a processing stage analogous to the processing stage described in association with FIG. 1F, e.g., removing portions of dielectric 116 and top electrode 118 to isolate adjacent remaining portions of phase change material 120. As is evident from a review of FIG. 2E, portions of phase change material 220 above conductive surfaces are already isolated from each other according to the process flow described herein. However, in some instances, the embodiments of FIGS. 1A-1G may be advantageous over the embodiments of FIGS. 2A-2F, if the unused material contributes to performance degradations of a memory device created thereby.

Figure 2F:
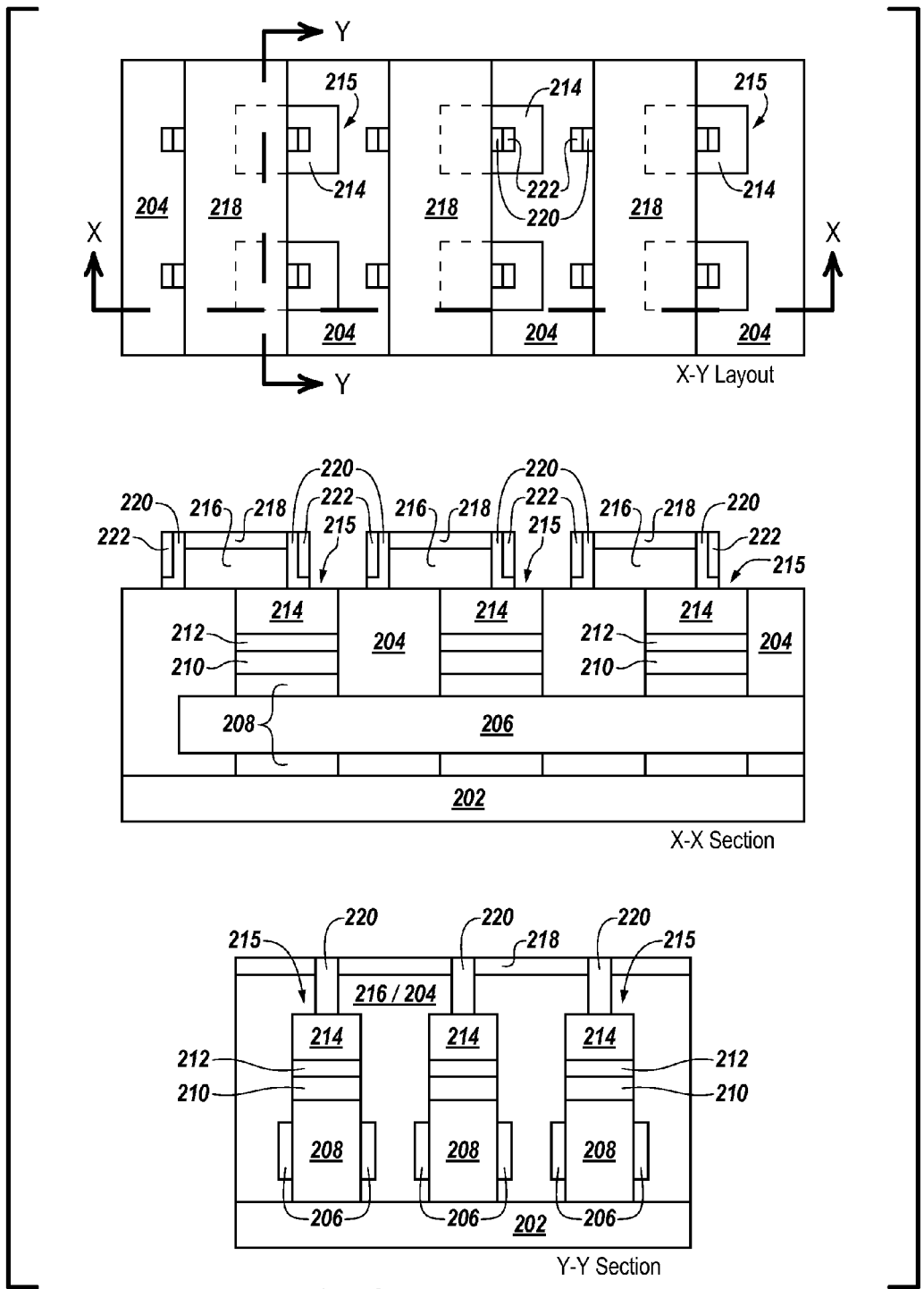

FIG. 2F illustrates further processing subsequent to the processing stage illustrated in FIG. 2E. The process stage of FIG. 2F is analogous to that of FIG. 1G, with the exception of the underlying structural and/or material differences described above. As best illustrated in the XY top plan view of FIG. 2F, portions of the phase change material 220 and the additional dielectric 222 can be removed between vertical transistors 215 that are adjacent to each other in the Y direction as described herein. Removed portions of the phase change material 220 and the additional dielectric 222 can extend from above a distal edge of a particular vertical transistor 215 to above a proximal edge of an adjacent vertical transistor 215 in the Y direction, where the distal edge of the particular vertical transistor 215 is closer to the proximal edge of the adjacent vertical transistor 215 than to the distal edge of the adjacent vertical transistor 215 in the Y direction. Thus, such removal can leave a vertical strip of phase change material 220 formed on a portion of a side of the top electrode 218 and a portion of a side of the dielectric 216 extending along the top electrode 218 and the dielectric 216 in a vertical direction into contact with the bottom electrode 214, e.g., the vertical transistor 215 that underlies the phase change material 220. However, unlike the embodiments illustrated in FIG. 1G, an opposite side of the dielectric 216 and top electrode 218 also include vertical strips of phase change material 220 and the additional dielectric 222. The resulting vertical transistor phase change memory cell, however, can be analogous to that created in association with the embodiments of FIGS. 1A-1G, e.g., as illustrated in FIG. 1H.

Figure 3A:
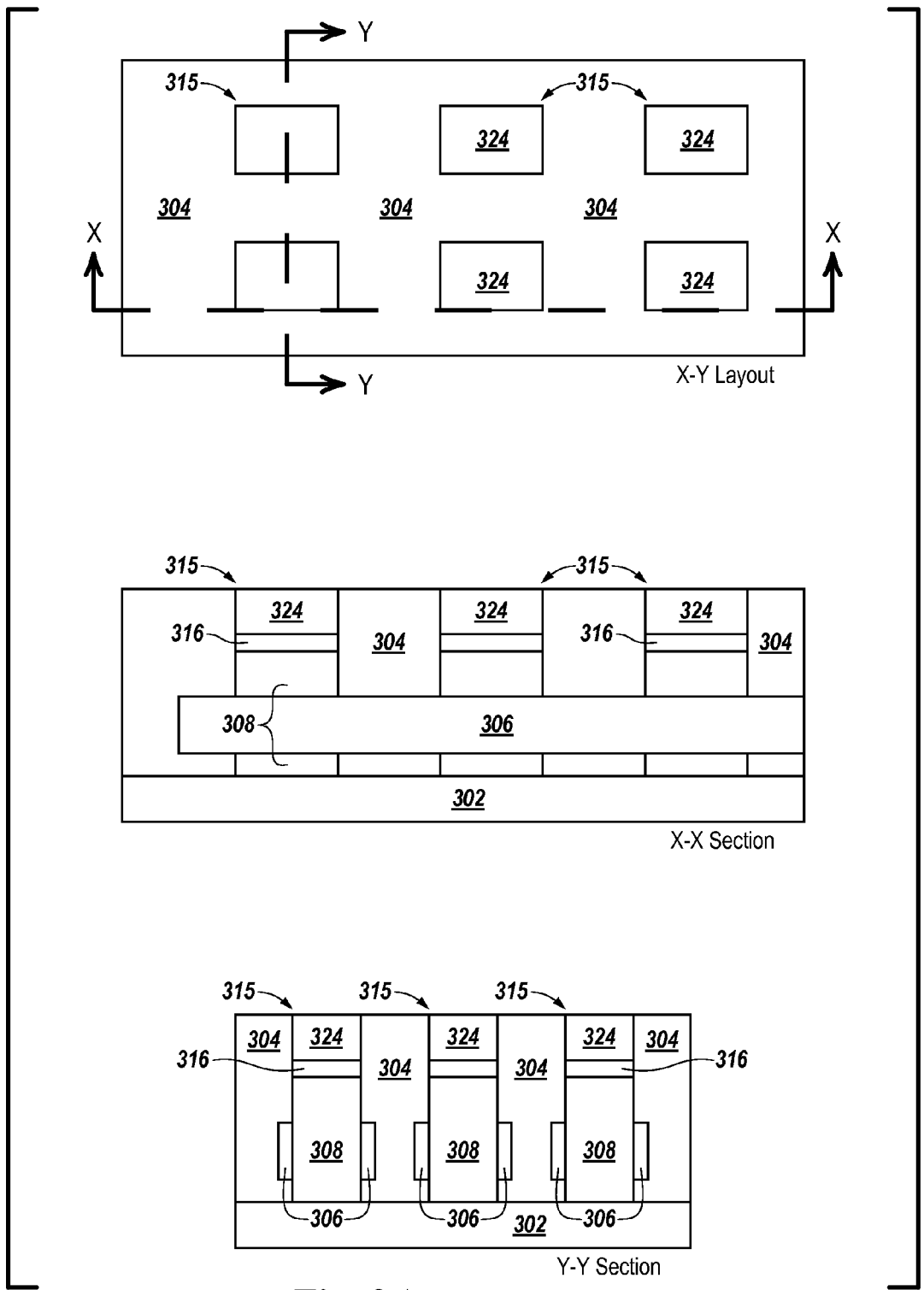
FIGS. 3A-3D illustrate process stages associated with forming a phase change memory cell in accordance with embodiments of the present disclosure.

FIGS. 3A-3D illustrate process stages associated with forming a phase change memory cell in accordance with embodiments of the present disclosure. FIGS. 3A-3D illustrate top plan views (XY) of a number of vertical transistors 315, first cross-sectional views (X) taken along cut line X-X, and second cross-sectional views (Y) taken along cut line Y-Y. As illustrated in FIG. 3A, the vertical transistors 315, e.g., MOSFETs, can be formed on a substrate 302, e.g., silicon, and can have a common source and side gates 306. Side gates 306 can be formed of a conductive material and can be formed in contact with opposite sides of a base 308 of a vertical transistor pillar, e.g., P– doped silicon, as shown in the Y cross-sectional view of FIG. 3A, or can be separated from the base 308 by a gate oxide.

Adjacent vertical transistors 315 can be separated by a bulk material 304 such as silicon dioxide. A dielectric 316 can be included on the base 308 of the vertical pillars. For example, the dielectric 316 can be silicon dioxide, e.g., a same material as the bulk material 304. A sacrificial material 324, e.g., silicon nitride can be included on the dielectric 316.

Figure 3B:
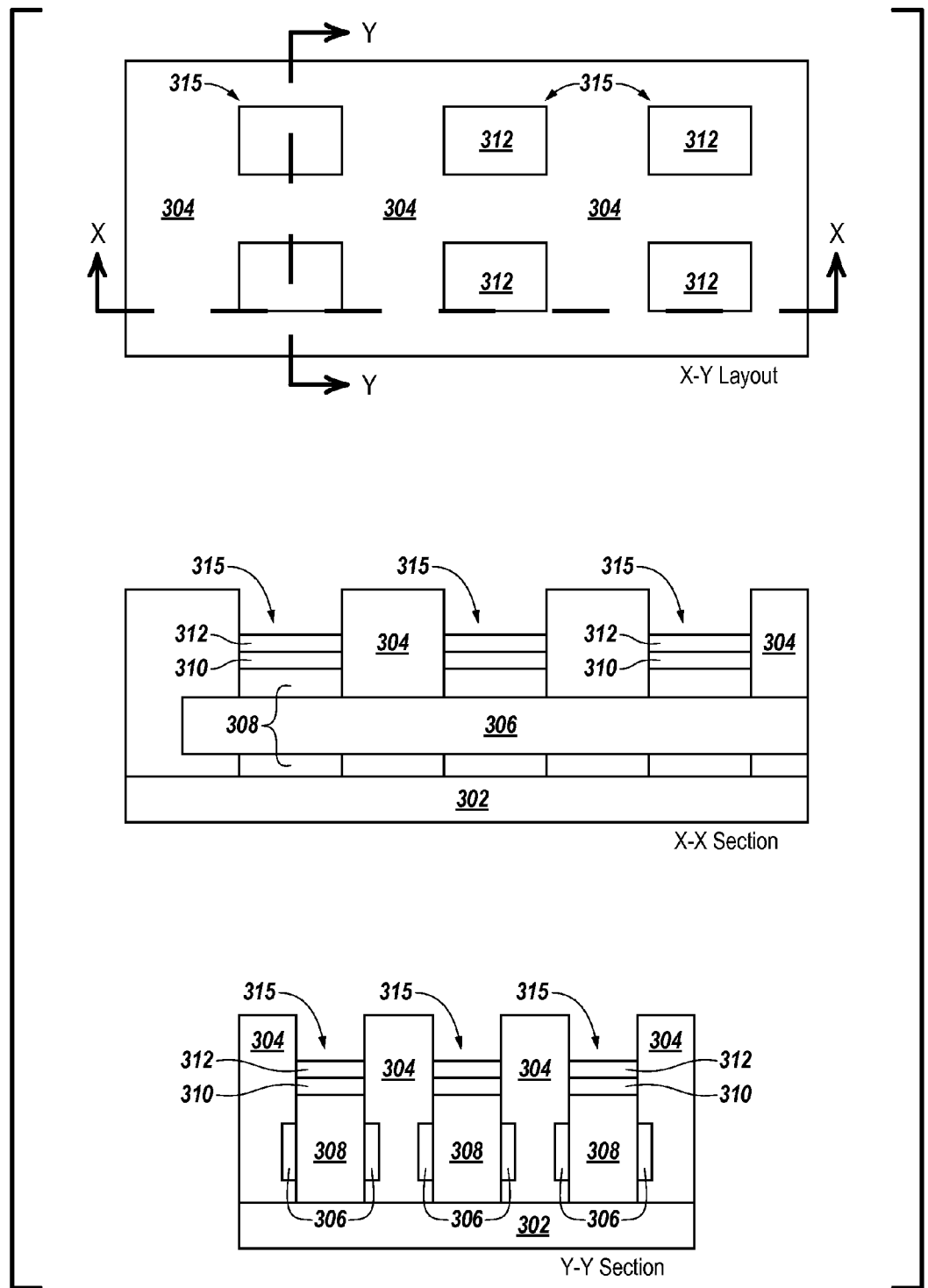

FIG. 3B illustrates further processing subsequent to the processing stage illustrated in FIG. 3A. The sacrificial material 324 can be removed, e.g., a silicon nitride hard mask can be removed. Subsequently, the exposed pillar, e.g., dielectric 316 can be processed. For example, N+ doping can be used to form region 310, e.g., N+ doped silicon. The top of the N+ doped silicon region 310 can be processed to form a silicide 312, e.g., cobalt silicide ($CoSi_2$) by deposition of cobalt on the vertical transistor pillar followed by thermal annealing.

Figure 3C:
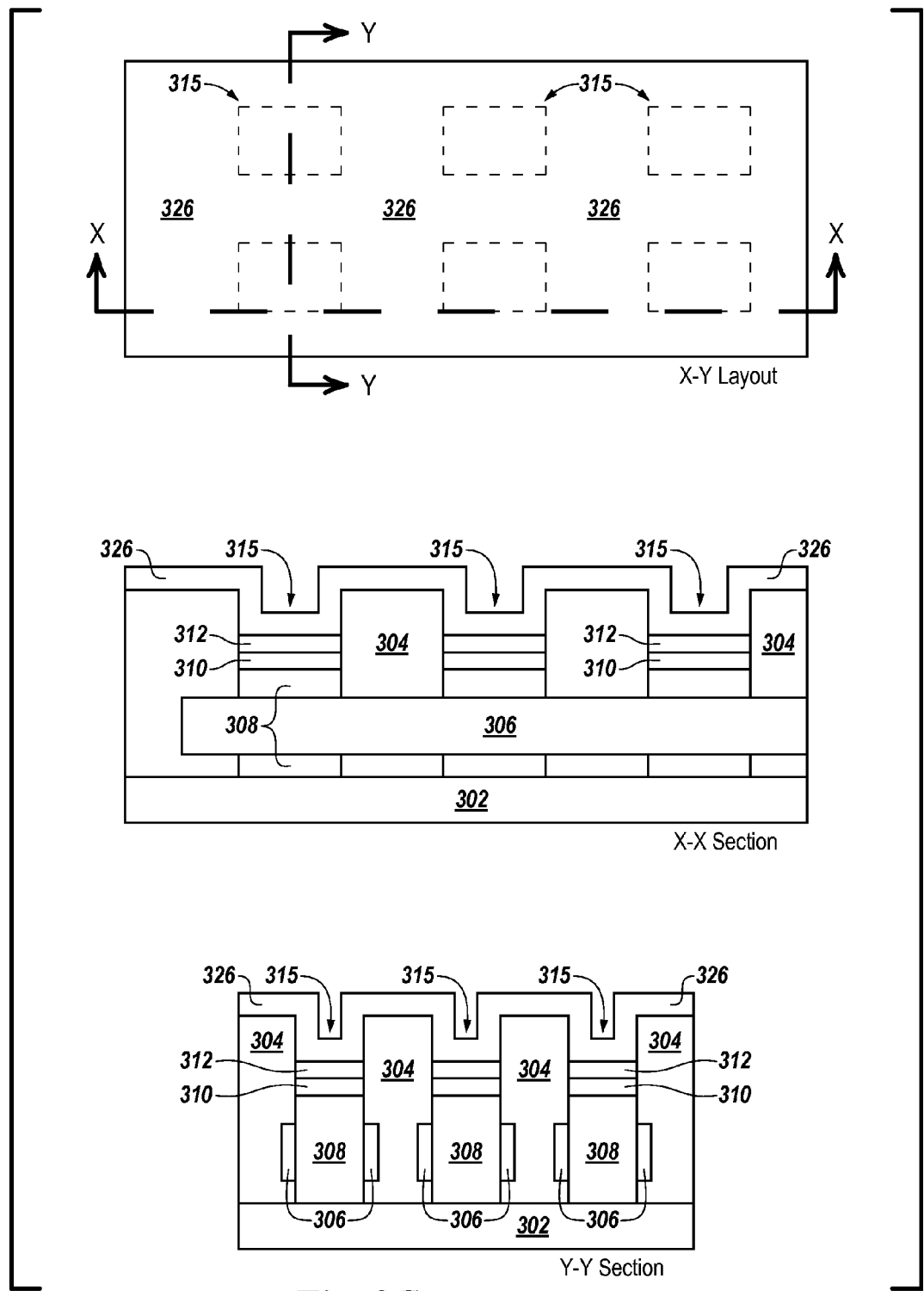

FIG. 3C illustrates further processing subsequent to the processing stage illustrated in FIG. 3B. Spacer material 326 can be formed on the top of the exposed vertical transistor pillars 315, e.g., on top of the silicide 312, and on top of the bulk material 304. In some embodiments, the spacer material 326 can be conformally deposited on the top of the vertical transistor pillars 315 and on top of the bulk material 304 such that a substantially uniform thickness in a vertical direction and/or horizontal direction, as illustrated in the X and Y cross-sectional views of FIG. 3C, is formed at least on top of the silicide 312, e.g., on top of the vertical transistors 315, on top of the bulk material 304, and on side surfaces of the bulk material 304. As illustrated in the Y cross-sectional view of FIG. 3C, the spacer material 326 can be formed such that only narrow (in the X direction) vertical openings remain. As used with respect to FIG. 3C, the narrow vertical opening indicates at least that the opening is substantially narrower than one feature width (1F).

Spacer material 326 can be, for example, a dielectric spacer material. Dielectric spacer material can include, for example, oxide dielectric spacers, such as silicon dioxide, and nitride dielectric spacers, such as silicon nitride. However, embodiments of the present disclosure are not limited to a particular type of spacer material.

Figure 3D:
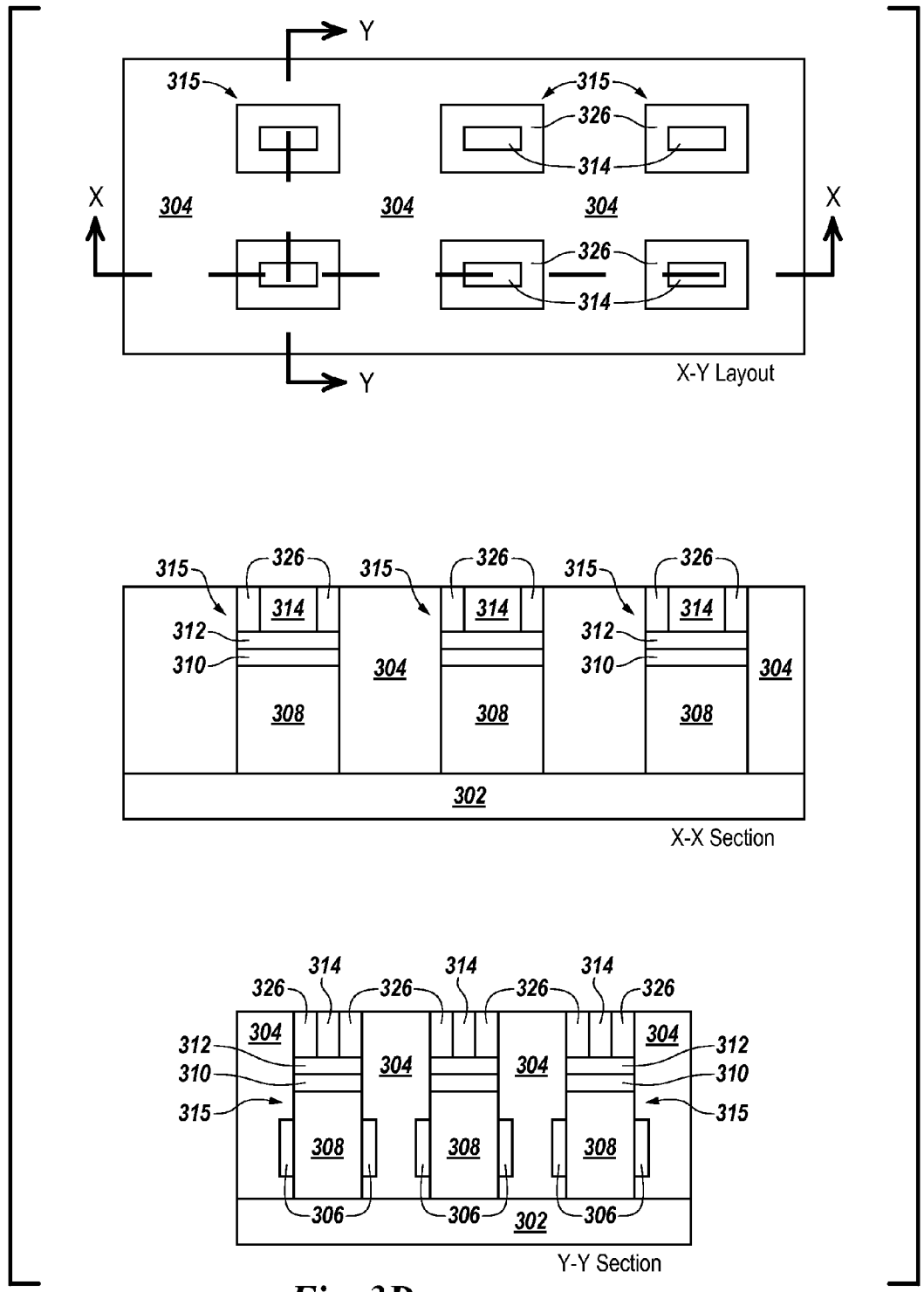

FIG. 3D illustrates further processing subsequent to the processing stage illustrated in FIG. 3C. Portions of the spacer material 326 can be removed, e.g., spacer etched, from a top of the array of vertical transistors 315 to a depth equal to a thickness of the spacer material 326 (in the vertical direction as illustrated in the X cross-sectional view of FIGS. 3C-3D), e.g., thicknesses of the conformal deposition of the spacer material 326. Such removal can leave spacer material 326 around an inner periphery of the exposed pillar of the vertical transistor 315, e.g., on sides of the bulk material 304 and on top of the silicide 312.

An electrode 314, e.g., a bottom electrode, can be formed in the opening on top of the silicide 312 and surrounded on four sides by the spacer 326 on the pillars of the vertical transistors 315. The electrode 314 can be formed of a conductive material. As illustrated in the Y cross-sectional view and the XY top plan view of FIG. 3D, the bottom electrode 314 can be formed in the narrow (in the X direction) vertical opening between the spacer material 326. As used with respect to FIG. 3D, the narrow vertical opening indicates at least that the opening is substantially narrower than one feature width (1F). Thus, the bottom electrode 314 can be said to form a vertical line electrode 314.

Figure 3E:
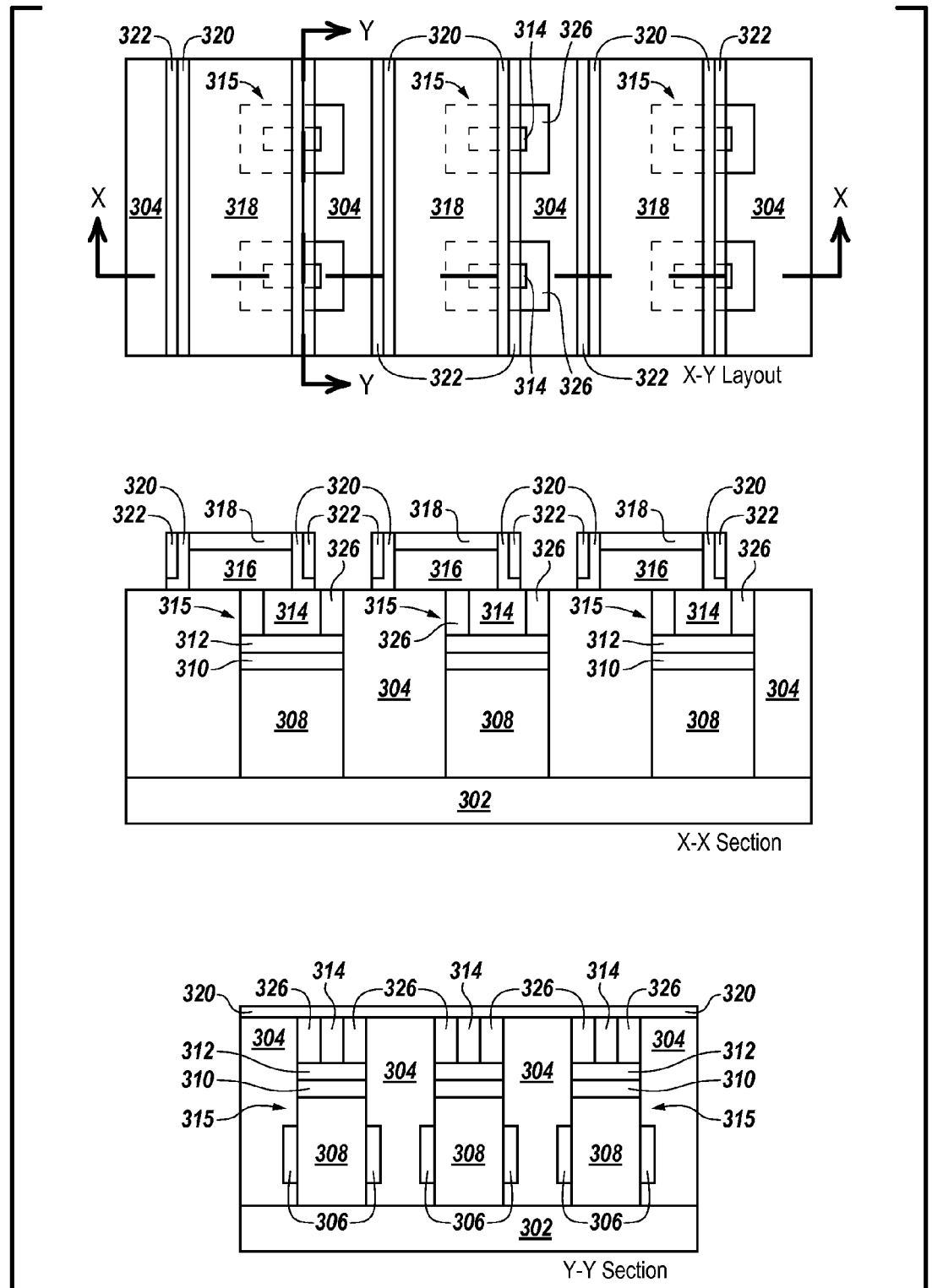
FIG. 3E illustrates further processing subsequent to the processing stage illustrated in FIG. 3D in accordance with embodiments of the present disclosure.
Figure 3F:
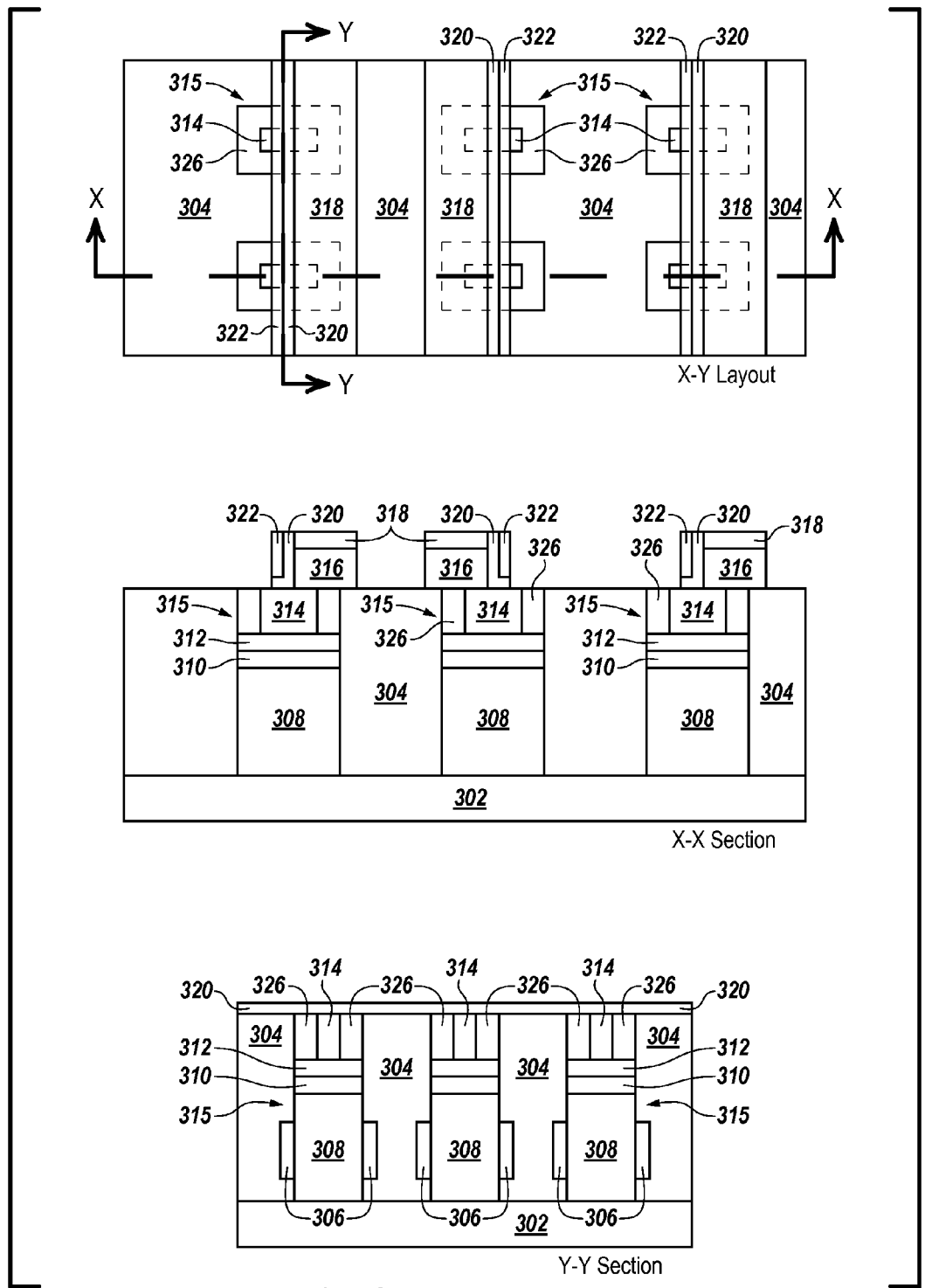
FIG. 3F illustrates further processing subsequent to the processing stage illustrated in FIG. 3D in accordance with embodiments of the present disclosure.

FIG. 3E illustrates further processing subsequent to the processing stage illustrated in FIG. 3D in accordance with embodiments of the present disclosure. The process stages to arrive at FIG. 3E from FIG. 3D are analogous to those of FIGS. 1B-1G, with the exception of the underlying structural and/or material differences described above with respect to FIGS. 3A-3D. FIG. 3F illustrates further processing subsequent to the processing stage illustrated in FIG. 3D in accordance with embodiments of the present disclosure. The process stages to arrive at FIG. 3E from FIG. 3D are analogous to those of FIGS. 2B-2F, with the exception of the underlying structural and/or material differences described above with respect to FIGS. 3A-3D.

That is, a dielectric 316 can be formed on at least a portion of the vertical line electrode 314, e.g., on a top surface of the vertical line electrode 314. A top electrode 318, e.g., a bit line, can be formed on the dielectric 316, e.g., on a top surface of the dielectric 316. A phase change material 320 can be formed on and in contact with the vertical line electrode 314, the dielectric 316, and the top electrode 318. More specifically, the phase change material 320 can be formed on a top surface of the vertical line electrode 314, on a side surface of the dielectric 316, and on a side surface of the top electrode 318. The phase change material 320 can be formed as a vertical line in a direction, e.g., the Y direction, orthogonal to a direction of the vertical line electrode 314, e.g., the X direction. An additional dielectric 322 can be formed on a side surface of the phase change material 320.

Figure 3G:
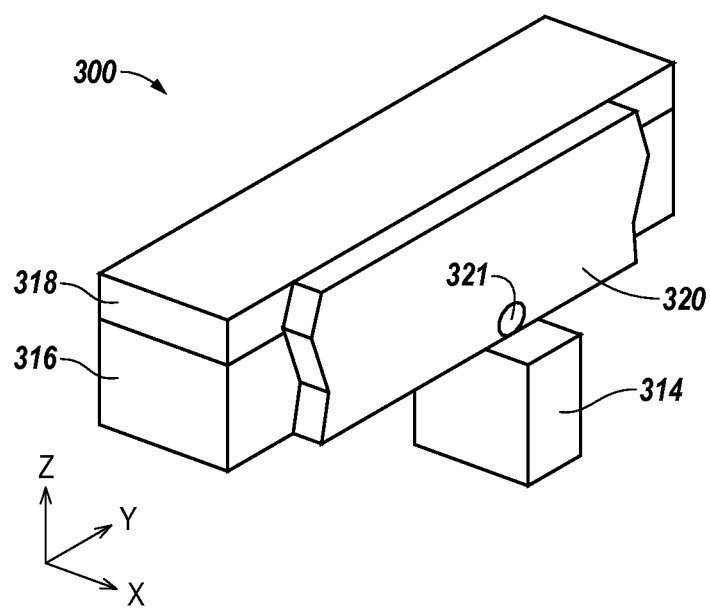
FIG. 3G illustrates a perspective view of a phase change memory cell in accordance with embodiments of the present disclosure.

FIG. 3G illustrates a perspective view of a phase change memory cell in accordance with embodiments of the present disclosure. As illustrated in FIG. 3G, the phase change material 320 extends across the width (in the Y direction) of the side of the dielectric 316 and the top electrode 318. The phase change material 320 extends across the entire height (in the Z direction) of the dielectric 316 and the top electrode 318, e.g., from a top surface of the top electrode 318 to a top surface of the vertical line electrode 314. The phase change material 320 is in direct physical contact with the top electrode 318, the dielectric 316, and the vertical line electrode 314. Because of the narrowness (in the X direction) of the phase change material 320 and the narrowness (in the Y direction) of the vertical line electrode 314, the intersection of the two can be referred to as a point contact. Such a point contact can significantly reduce an amount of programming current used to alter the state of the phase change material 320.

The phase change material 320 can be on, and in contact with, the dielectric 316 and the top electrode 318 by a common plane, e.g., a Y-Z plane as illustrated in FIG. 3G. The common plane can include side surfaces of the dielectric 316, the top electrode 318, and the phase change material 320.

The additional dielectric 322 is omitted from the illustration of FIG. 3G in order to provide a better illustration of the active region 321 of the phase change material 320 created by operation of the vertical transistor phase change memory cell 300 according to embodiments of the present disclosure. As illustrated in FIG. 3G, the active region 321 is located on the dielectric 316 and on the point contact between the phase change material 320 and the vertical line electrode 314. According to one or more embodiments of the present disclosure, the active region 321 may not be in direct physical contact with the top electrode 318.

Figure 4:
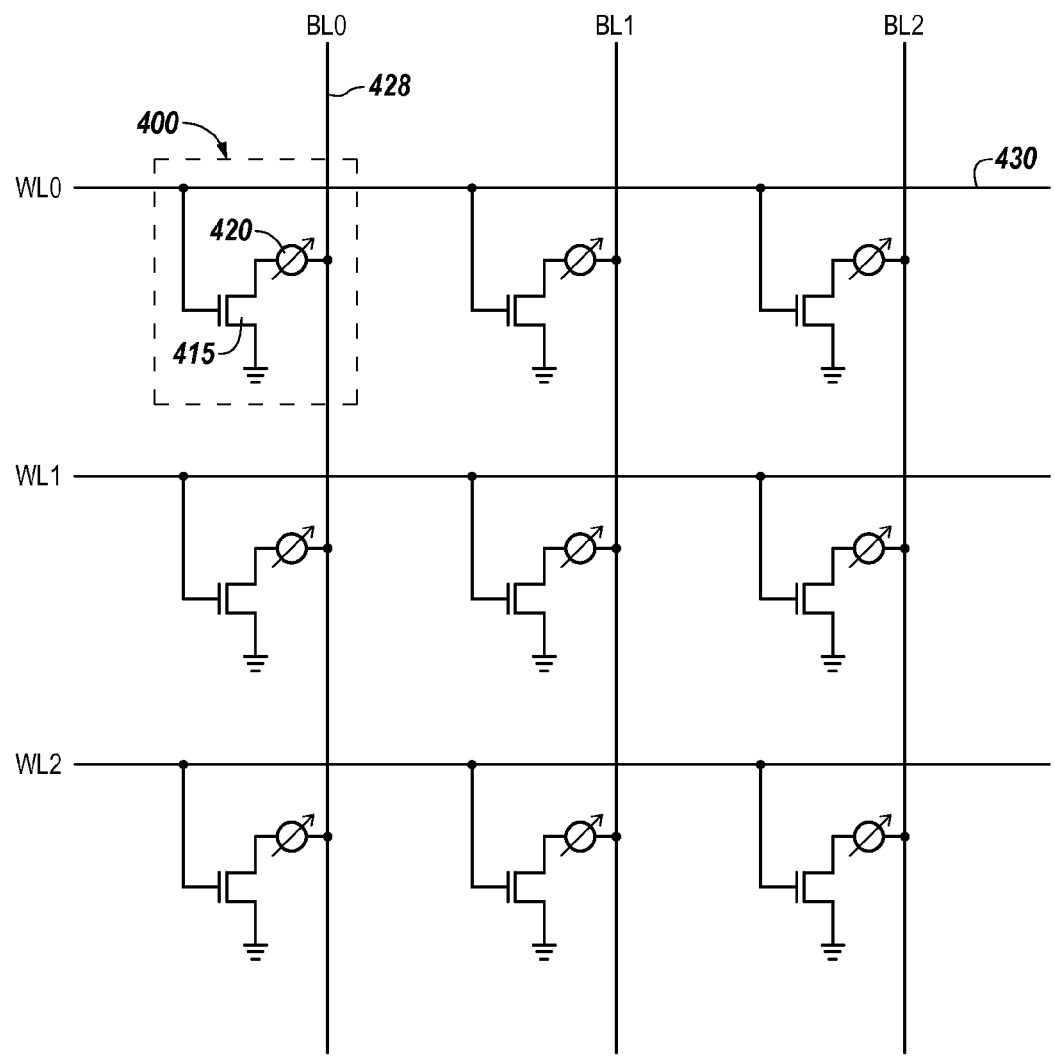
FIG. 4 is a schematic of a portion of a phase change memory array in accordance with embodiments of the present disclosure.

FIG. 4 is a schematic of a portion of a phase change memory array 450 in accordance with embodiments of the present disclosure. Phase change memory array 450 includes a number of phase change memory cells 400 each having an associated access device 415 and phase change memory material 420. Phase change memory material 420 can be processed in accordance with a number of embodiments of the present disclosure.

Access devices 415 can be operated, e.g., e.g., turned on/off, to access the memory cells in order to perform operations such as programming, e.g., writing, and/or sensing, e.g., reading, operations on the memory cells. In the embodiments illustrated herein, access devices 415 are field effect transistors (FETs). Other access devices can include diodes and bipoloar junction transistors (BJTs). Diodes can include, for example, p-n diodes, Zener diodes, and Schottky diodes.

As shown in FIG. 4, each access device 415 associated with each memory cell 400 is coupled to one of a number of access lines 430, such as word lines WL0, WL1, WL2, etc. Each word line 430 is coupled to a "row" of phase change memory cells 400. The use of the term "row" is not meant to imply a particular linear and/or horizontal orientation of the memory cells 400. Rather, a row can mean a number of memory cells 400 coupled to a particular word line 430, regardless of the orientation of the memory cells 400. For example, a row can include a number of memory cells 400 coupled to a particular word line 430 in a staggered, non-linear orientation.

As shown in FIG. 4, each phase change memory material 420 is coupled to one of a number of data lines 428, such as bit lines BL0, BL1, BL2, etc. Each bit line 428 is coupled to a "column" of phase change memory cells 400. For ease of addressing in the digital environment, the number of word lines 430 and the number of bit lines 428 can each be some power of two, e.g., 256 word lines 430 by 4,096 bit lines 428. However, embodiments are not limited to particular numbers of word lines 430 and/or bit lines 428. Further, the use of the term "column" is not meant to imply a particular linear and/or vertical orientation of the memory cells 400. Rather, a column can mean a number of memory cells 400 coupled to a particular bit line 428, regardless of the orientation of the memory cells 400. For example, a column can include a number of memory cells 400 coupled to a particular bit line 428 in a staggered, e.g., non-linear, fashion.

In operation, appropriate voltage and/or current signals, e.g., pulses, can be applied to bit lines 428 and/or word lines 430 in order to program data to and/or sense data from the phase change memory cells 400 of phase change memory array 450. For example, during a programming operation, a current, e.g., a programming current, can be used to heat an electrode associated with phase change memory material 420 to program the phase change memory cells 400, as previously described herein.

The memory cells 400 shown in phase change memory array 450 can be single level cells (SLCs) and/or multilevel cells (MLCs), e.g., single level PCRAM cells 400 and/or multilevel PCRAM cells 400. A single level PCRAM cell 400 can be programmed to a generally more amorphous (reset) state or a generally more crystalline (set) state. Such reset and/or set states can correspond to a binary 0 and/or 1. A reset pulse can include a relatively high current pulse applied to the PCRAM cell 400, e.g., to an electrode of the PCRAM cell 400, for a relatively short period of time. The current applied to the PCRAM cell 400 can be quickly reduced after the PCRAM cell material 420 of the PCRAM cell 400 "melts," allowing the PCRAM cell material 420 to cool quickly into a more amorphous state where atomic motion that can allow crystallization generally occurs to a lesser degree due, at least in part, due to relatively rapid cooling of the PCRAM cell material 420. Conversely, a set pulse can include a relatively lower current pulse applied to the cell 400 for a relatively longer period of time with a slower quenching speed, e.g., the current can be more slowly reduced allowing the PCRAM cell material 420 greater time to cool. Accordingly, the PCRAM cell material 420 can crystallize to a greater degree than after the reset pulse. Some PCRAM cell materials 420 can have a greater resistivity associated with a more amorphous state and a lesser resistivity associated with a more crystalline state.

Multilevel PCRAM cells 400 can be programmed to a number of intermediate states between amorphous and crystalline. For example, multilevel PCRAM cells 400 can be programmed to various levels of structural order. Through application of a number of programming pulses at particular current levels, the PCRAM cells 400 can be programmed to a given resistance state. With appropriate programming currents, the PCRAM cells 400 can be programmed to a number of intermediate states having a partial amorphous and a partial crystalline structure, providing for multilevel resistance states. The number of data states chosen for a particular PCRAM cell 400 can be based on, for example, the desired application, design and process limits, e.g., programming time, sensing time, and accuracy of sensing circuitry, and other factors.

In a number of embodiments, phase change memory array 450 can include phase change memory cells 400 stacked in a three-dimensional configuration. That is, phase change memory array 450 can include a first number of phase change memory cells 400, and a second number of phase change memory cells 400 stacked on top of the first number of phase change memory cells 400.

For example, phase change memory array 450 can include one or more additional rows of phase change memory cells 400 stacked on top of the row of phase change memory cells 400 coupled to a word line 430. Phase change memory array 450 can also include one or more additional columns of phase change memory cells 400 stacked on top of the column of phase change memory cells 400 coupled to a bit line 428. In a number of embodiments, each column of phase change memory cells 400 in a particular column stack can be coupled to a common, e.g., the same, bit line 428.

Embodiments of the present disclosure are not limited to phase change memory array 450 illustrated in FIG. 4. For example, a memory array can have an architecture other than that illustrated in FIG. 4, as will be understood by one of ordinary skill in the art. Further, as one of ordinary skill in the art will appreciate, phase change memory array 450 can be coupled to a controller, e.g., control circuitry, and/or programming and sensing circuitry (not shown in FIG. 4).

CONCLUSION

Vertical transistor phase change memory and methods of processing phase change memory are described herein. One or more method embodiments include forming a dielectric on at least a portion of a vertical transistor, forming an electrode on the dielectric, and forming a vertical strip of phase change material on a portion of a side of the electrode and on a portion of a side of the dielectric extending along the electrode and the dielectric into contact with the vertical transistor.

Although specific embodiments have been illustrated and described herein, those of ordinary skill in the art will appreciate that an arrangement calculated to achieve the same results can be substituted for the specific embodiments shown. This disclosure is intended to cover adaptations or variations of various embodiments of the present disclosure. It is to be understood that the above description has been made in an illustrative fashion, and not a restrictive one. Combination of the above embodiments, and other embodiments not specifically described herein will be apparent to those of skill in the art upon reviewing the above description. The scope of the various embodiments of the present disclosure includes other applications in which the above structures and methods are used. Therefore, the scope of various embodiments of the present disclosure should be determined with reference to the appended claims, along with the full range of equivalents to which such claims are entitled.

In the foregoing Detailed Description, various features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. A phase change memory cell, comprising:
a vertical transistor including a bottom electrode on a pillar;
a phase change material on a side surface of a top electrode, on a side surface of a dielectric, and on a top surface of the bottom electrode; and
side gates on opposite side surfaces of the vertical transistor.

2. The phase change memory cell of claim 1, including the dielectric on a top surface of a portion of the bottom electrode.

3. The phase change memory cell of claim 1, including the top electrode on the dielectric.

4. The phase change memory cell of claim 1, wherein a width of the phase change material is less than a width of the top surface of the bottom electrode.

5. The phase change memory cell of claim 1, wherein a width of the phase change material is less than a width of the side surface of the top electrode.

6. The phase change memory cell of claim 1, wherein the phase change memory cell includes additional phase change material on an opposite side surface of the top electrode and on an opposite side surface of the dielectric.

7. The phase change memory cell of claim 1, wherein the phase change memory cell includes an additional dielectric on a side surface of the phase change material opposite the side surface of the top electrode and opposite the side surface of the dielectric.

8. The phase change memory cell of claim 1, wherein the phase change material includes an active region on the dielectric between the top electrode and the bottom electrode.

9. The phase change memory cell of claim 1, wherein the phase change material extends from a top surface of the top electrode to a top surface of the bottom electrode.

10. A phase change memory cell, comprising:
a vertical transistor including a vertical line electrode;
a dielectric on a top surface of a portion of the vertical line electrode;
a top electrode on a top surface of the dielectric; and
a phase change material on a side surface of the top electrode, on a side surface of the dielectric, and on a top surface of the vertical line electrode, wherein the phase change material covers an entirety of the top surface of the vertical line electrode in a first direction and extends beyond the top surface of the vertical line electrode in the first direction, and wherein the phase change material covers only a portion of the top surface of the vertical line electrode in a second direction orthogonal to the first direction.

11. The phase change memory cell of claim 10, wherein the phase change material is in point contact with the vertical line electrode.

12. The phase change memory cell of claim 10, wherein the phase change material includes an active region on the dielectric and on the point contact.

13. The phase change memory cell of claim 10, wherein the phase change memory cell includes a spacer surrounding side surfaces of the vertical line electrode.

14. The phase change memory cell of claim 10, wherein the top electrode comprises a data line.

15. The phase change memory cell of claim 10, wherein the vertical transistor is a metal oxide semiconductor field effect transistor (MOSFET).

16. An array of phase change memory cells, comprising:
a dielectric on an array of vertical transistors;
an electrode on the dielectric; and
a phase change material on, and in contact with, the dielectric and the electrode by a common plane, wherein the phase change material is on, and in contact with, a plurality of vertical transistors of the array of vertical transistors.

17. The array of claim 16, including additional phase change material on, and in contact with, opposite sides of the dielectric and the electrode by a second common plane.

18. A phase change memory cell, comprising:
- a vertical transistor including a vertical line electrode, wherein the width of the vertical line electrode is less than a feature width;
- a dielectric on a top surface of a portion of the vertical line electrode;
- a top electrode on a top surface of the dielectric; and
- a phase change material on a side surface of the top electrode.

19. The phase change memory cell of claim 18, wherein the phase change memory cell includes a spacer surrounding side surfaces of the vertical line electrode.

20. The phase change memory cell of claim 18, including side gates on opposite side surfaces of the vertical transistor.

* * * * *